(12) United States Patent
Boyd et al.

(10) Patent No.: US 10,837,102 B2
(45) Date of Patent: Nov. 17, 2020

(54) METHOD AND SYSTEM FOR GRAPHENE FORMATION

(71) Applicant: CALIFORNIA INSTITUTE OF TECHNOLOGY, Pasadena, CA (US)

(72) Inventors: David A. Boyd, La Cañada Flintridge, CA (US); Nai-Chang Yeh, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/015,672

(22) Filed: Jun. 22, 2018

(65) Prior Publication Data

US 2019/0010604 A1  Jan. 10, 2019

Related U.S. Application Data

(62) Division of application No. 14/152,751, filed on Jan. 10, 2014, now Pat. No. 10,041,168.

(60) Provisional application No. 61/752,209, filed on Jan. 14, 2013, provisional application No. 61/752,549, filed on Jan. 15, 2013, provisional application No.
(Continued)

(51) Int. Cl.
| | |
|---|---|
| *H05H 1/46* | (2006.01) |
| *C23C 16/26* | (2006.01) |
| *C01B 32/184* | (2017.01) |
| *C01B 32/186* | (2017.01) |
| *C23C 16/44* | (2006.01) |
| *C23C 16/511* | (2006.01) |

(52) U.S. Cl.
CPC ............ *C23C 16/26* (2013.01); *C01B 32/184* (2017.08); *C01B 32/186* (2017.08); *C23C 16/4405* (2013.01); *C23C 16/511* (2013.01); *Y10T 428/24355* (2015.01)

(58) Field of Classification Search
CPC .............................. C23C 16/26; C23C 16/511
USPC .................................................. 427/575, 577
See application file for complete search history.

(56) References Cited

U.S. PATENT DOCUMENTS

| | | | |
|---|---|---|---|
| 5,518,759 A * | 5/1996 | Sevillano | ............. C23C 16/274 423/446 |
| 7,202,205 B1 | 4/2007 | Connor et al. | |

(Continued)

FOREIGN PATENT DOCUMENTS

| | | |
|---|---|---|
| CN | 1325372 | 7/2007 |
| CN | 102260858 | 11/2011 |

(Continued)

OTHER PUBLICATIONS

Y.T. Lee; Derwent abstract (2016-46073G; week 201659) of KR 2016086204 A, published Jul. 19, 2016.*

(Continued)

*Primary Examiner* — Marianne L Padgett
(74) *Attorney, Agent, or Firm* — Kilpatrick Townsend & Stockton LLP

(57) ABSTRACT

A method of forming graphene includes placing a substrate in a processing chamber and introducing a cleaning gas including hydrogen and nitrogen into the processing chamber. The method also includes introducing a carbon source into the processing chamber and initiating a microwave plasma in the processing chamber. The method further includes subjecting the substrate to a flow of the cleaning gas and the carbon source for a predetermined period of time to form the graphene.

17 Claims, 17 Drawing Sheets

Related U.S. Application Data

61/897,082, filed on Oct. 29, 2013, provisional application No. 61/907,628, filed on Nov. 22, 2013.

(56) References Cited

U.S. PATENT DOCUMENTS

| | | | |
|---|---|---|---|
| 10,023,469 B2* | 7/2018 | Cho | H01B 13/0036 |
| 10,041,168 B2 | 8/2018 | Boyd et al. | |
| 10,465,291 B2* | 11/2019 | Yeh | C01B 32/186 |
| 2004/0253167 A1 | 12/2004 | Silva et al. | |
| 2005/0170543 A1* | 8/2005 | Sugawara | H01L 21/28176 |
| | | | 438/38 |
| 2008/0098805 A1* | 5/2008 | Jin | G01Q 60/38 |
| | | | 73/105 |
| 2010/0101728 A1* | 4/2010 | Iwasaki | H01J 37/32192 |
| | | | 156/345.33 |
| 2010/0209665 A1* | 8/2010 | Konovalov | B82Y 30/00 |
| | | | 428/141 |
| 2010/0291754 A1 | 11/2010 | Koyama et al. | |
| 2011/0200787 A1 | 8/2011 | Regan et al. | |
| 2011/0268910 A1 | 11/2011 | Bratkovski et al. | |
| 2012/0098028 A1* | 4/2012 | Naito | H01L 51/0036 |
| | | | 257/103 |
| 2012/0168721 A1 | 7/2012 | Kelber et al. | |
| 2012/0190208 A1* | 7/2012 | Ozu | H01J 37/3244 |
| | | | 438/710 |
| 2012/0196074 A1 | 8/2012 | Ago et al. | |
| 2012/0328906 A1 | 12/2012 | Kwon et al. | |
| 2013/0052119 A1* | 2/2013 | Kim | B82Y 30/00 |
| | | | 423/445 B |
| 2013/0052121 A1 | 2/2013 | Hasegawa et al. | |
| 2013/0115781 A1* | 5/2013 | Matsumoto | H01J 37/32192 |
| | | | 438/726 |
| 2014/0014400 A1* | 1/2014 | Mori | B29C 45/1418 |
| | | | 174/254 |
| 2014/0044885 A1* | 2/2014 | Boyd | C23C 16/52 |
| | | | 427/534 |
| 2014/0272108 A1* | 9/2014 | Holber | C23C 16/505 |
| | | | 427/8 |
| 2015/0037515 A1 | 2/2015 | Fisher et al. | |
| 2016/0280968 A1* | 9/2016 | Lee | C09J 9/02 |
| 2017/0210629 A1* | 7/2017 | Cho | H01B 13/0036 |
| 2019/0093227 A1* | 3/2019 | Yeh | C23C 16/513 |
| 2019/0144283 A1* | 5/2019 | Jakobsen | C23C 16/545 |
| | | | 427/249.1 |

FOREIGN PATENT DOCUMENTS

| | | |
|---|---|---|
| CN | 107419236 B | 7/2019 |
| EP | 2548995 | 1/2013 |
| KR | 20120138812 | 12/2012 |
| KR | 1020120138812 | 12/2012 |
| WO | 2011105530 | 9/2011 |
| WO | 2011115197 | 9/2011 |
| WO | WO 2012/137923 A1 * | 10/2012 ............ H01B 5/14 |
| WO | 2014110446 | 7/2014 |

OTHER PUBLICATIONS

Y.T. Lee; Derwent abstract (2016-44782E; week 201659) of KR 201608905 A, published Jul. 11, 2016.*
Webster's Ninth New Collegiate Dictionary; Merriam-Webster Inc., publishers; Springfield, Massachusetts, USA; 1990 (no month); excerpt pp. 573.*
Kalita et al., "Low temperature growth of graphene film by microwave assisted surface wave plasma CVD for transparent electrode application", RSC Advances; vol. 2, Feb. 8, 2012, pp. 2815-2820
KR10-2015-7021210, "Office Action", dated Apr. 13, 2018, 9 pages.
Li et al., "Low-temperature growth of Graphene by Chemical Vapor Deposition Using Solid and Liquid Carbon Sources", ACS Nano, vol. 5, No. 4, Mar. 25, 2011, pp. 3385-3390.
PCT/US2014/011149, International Search Report and Written Opinion, Jul. 7, 2014, 11 pages.
Robinson et al., "Raman Topography and Strain Uniformity of Large-Area Epitaxial Graphene", Nano Letters, vol. 9, No. 3, Jan. 30, 2009, pp. 964-968.
Yeh et al., "Strain-induced pseudo-magnetic fields and charging effects on CVD-grown graphene", Surface Science vol. 605, 2011, pp. 1649-1656.
KR10-2015-7021210, "Notice of Decision to Grant", dated Nov. 28, 2018, 2 pages.
Wu et al., "Quantum Behavior of Graphene Transistors Near the Scaling Limit", Nano Letter, vol. 12, No. 3, 2012, pp, 1417-1423.
CN201710654905.4 , "Notice of Decision to Grant", dated Apr. 3, 2019, 3 pages.
KR1020197005808 , "Office Action", dated Jun. 12, 2019, 7 pages.
Li et al., "Large-Area Graphene Single Crystals Grown by Low-Pressure Chemical Vapor Deposition of Methane on Copper", J. Am. Chem. Soc. 2011, vol. 133, Feb. 10, 2011, pp. 2816-2819.
PCT/US2014/011149 , "International Preliminary Report on Patentability", dated Jul. 23, 2015, 7 pages.
PCT/US2014/011149 , "Invitation to Pay Additional Fees and wherever Applicable Protest Fee", dated Apr. 17, 2014, 2 pages.
Song, M.A. et al., "Characterization of an inductively coupled nitrogen-argon plasma by Langmuir probe combined with optical emission spectroscopy," Feb. 18, 2011, 12 pp., Physics of Plasmas 18(2), American Institute of Physics.

* cited by examiner

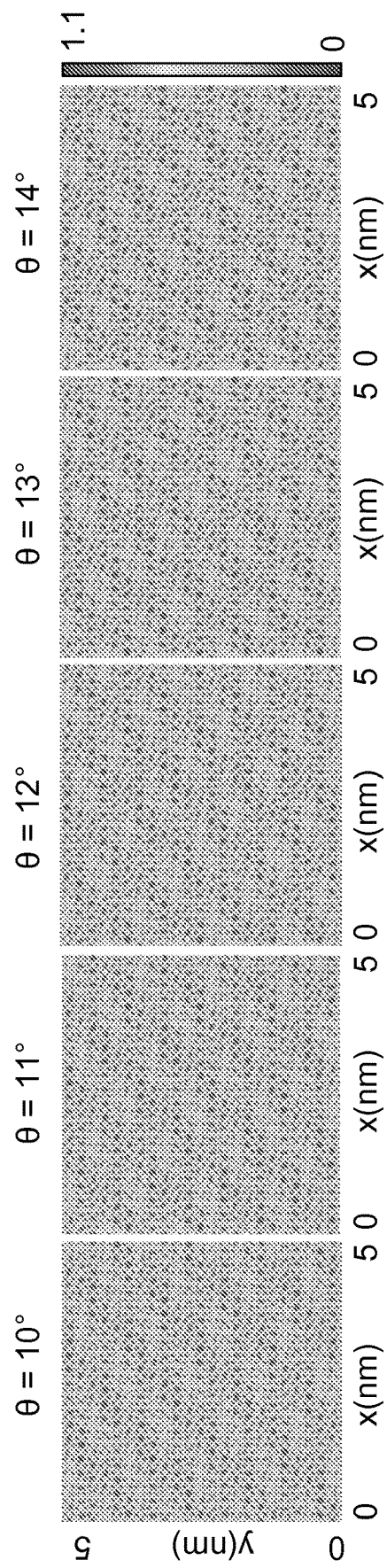
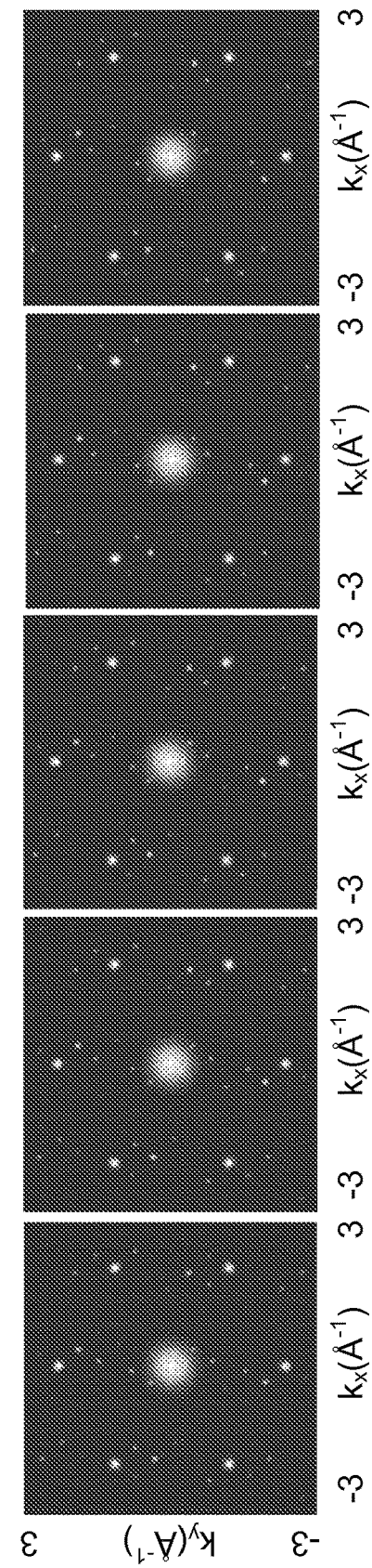
FIG. 9A  FIG. 9B  FIG. 9C  FIG. 9D  FIG. 9E
FIG. 9F  FIG. 9G  FIG. 9H  FIG. 9I  FIG. 9J

FIG. 13A  FIG. 13B

| Device | Electron Mobility (cm²V⁻¹s⁻¹) |
|---|---|
| 1 | 54,000 |
| 2 | 52,000 |
| 3 | 42,000 |
| 4 | 38,000 |
| 5 | 31,000 |
| 6 | 30,000 |
| 7 | 55,000 |
| 8 | 60,000 |
| 9 | 38,000 |
| Average | 44,400 |

METHOD AND SYSTEM FOR GRAPHENE FORMATION

CROSS-REFERENCES TO RELATED APPLICATIONS

This application is a divisional application of U.S. patent application Ser. No. 14/152,751 filed on Jan. 10, 2014, which claims priority to U.S. Provisional Patent Application No. 61/752,209, filed on Jan. 14, 2013, entitled "Superior Properties of Room-Temperature Grown Graphene by Plasma-Assisted Chemical Vapour Deposition," U.S. Provisional Patent Application No. 61/752,549, filed on Jan. 15, 2013, entitled "Superior Properties of Room-Temperature Grown Graphene by Plasma-Assisted Chemical Vapour Deposition, U.S. Provisional Patent Application No. 61/897,082, filed on Oct. 29, 2013, entitled "Superior Properties of Low-Temperature Grown Graphene by Plasma-Assisted Chemical Vapour Deposition, and U.S. Provisional Patent Application No. 61/907,628, filed on Nov. 22, 2013, entitled "Superior Properties of Low-Temperature Grown Graphene by Plasma-Assisted Chemical Vapour Deposition," the disclosures of which are hereby incorporated by reference in their entirety for all purposes.

STATEMENT AS TO RIGHTS TO INVENTIONS MADE UNDER FEDERALLY SPONSORED RESEARCH OR DEVELOPMENT

This invention was made with government support under 1125565 awarded by the National Science Foundation. The government has certain rights in the invention.

BACKGROUND OF THE INVENTION

Graphene, a monolayer of carbon atoms forming a two-dimensional honeycomb lattice structure, is considered a wonder material for both scientific research and technological applications. Its unique electronic, thermal, and mechanical properties and compatibility with lithographic techniques are ideal for many nano-electronic, spintronic, and mechanical applications; it is also promising for large-area optoelectronic devices such as touch screen displays and electrodes for photovoltaic cells and light emitting diodes.

Graphene has been produced by exfoliation from graphite. However, graphene produced in this manner is not suitable for many applications due to its inherently small size and the non-scalability of the process. Thermal CVD based on catalytic dehydrogenation of carbon precursors (e.g. methane) on transition metals (e.g. Cu, Ni, Pt, Co) is capable of producing graphene of technologically relevant scales. However, the need for multiple steps and high temperatures (~1000° C.) is incompatible with device fabrication and integration. Furthermore, high processing temperatures can result in substrate and film irregularities that diminish graphene quality. For instance, permanent strain and topological defects can induce giant pseudo-magnetic fields and charging effects, giving rise to localization and scattering of Dirac fermions. Thermal growth defects also contribute to the fragility of graphene sheets upon transference from the growth substrate.

Despite the progress made related to the formation of graphene films, there is a need in the art for improved methods and systems related to graphene production.

SUMMARY OF THE INVENTION

The present invention relates generally to methods and systems for material synthesis. More specifically, the present invention relates to methods and systems for growing high quality, large area graphene. Merely by way of example, the invention has been applied to a method of growing graphene at low (e.g., room) temperature under a reduced pressure atmosphere. The graphene produced using such methods exhibits structural, electronic, and mechanical properties that enable use of the graphene described herein in a variety of electronic, optical, optoelectronic and mechanical applications. The methods and techniques can be applied to a variety of graphene growth systems including CMOS compatible semiconductor growth processes.

Although graphene has shown promise as a device component, a major challenge in fully realizing the potential of graphene-based technologies is producing the inherently superior properties of graphene on a large scale. Embodiments of the present invention utilize a one-step method that employs plasma-enhanced chemical vapor deposition (PECVD) for rapidly producing superior quality, large-area ($\sim$1-cm$^2$), monolayer graphene on copper at low temperature (LT). As described herein, embodiments of the present invention enable the deposition of high-quality graphene on Cu by balancing carbon deposition by methyl radicals with etching of amorphous carbon by atomic hydrogen, while concurrently preparing the copper surface for growth by cyano radicals. Examination of LT-grown graphene on Cu foils, Cu (100) and Cu (111) single crystals by scanning tunneling microscopy (STM) and Raman spectroscopy confirm the excellent crystalline quality, significantly smoother surfaces, and greatly reduced strain relative to samples grown by thermal CVD techniques at 1000° C. Atomic force microscopy (AFM) and scanning electron microscopy (SEM) studies also reveal large grains of the LT-grown graphene. The 1-cm$^2$ sheets remained intact upon transference, which results from high mechanical integrity. Electrical mobility determined by the field-effect-transistor (FET) configuration exhibited consistently high values, up to 60,000 cm$^2$/V-s on BN at 300 K, which are better than the best values reported for thermal-CVD graphene on BN, even when post-annealed and measured at 4.2 K. Thus, embodiments open up a new pathway to large-scale, superior-quality graphene fabricated using a one-step, inexpensive fabrication process that is suitable for both scientific research and technological applications.

According to an embodiment of the present invention, a method of forming graphene is provided. The method includes placing a substrate in a processing chamber and introducing a cleaning gas including hydrogen and nitrogen into the processing chamber. The method also includes introducing a carbon source into the processing chamber and initiating a microwave plasma in the processing chamber. The method further includes subjecting the substrate to a flow of the cleaning gas and the carbon source for a predetermined period of time to form the graphene.

According to another embodiment of the present invention, a graphene structure is provided. The graphene structure includes a copper substrate and a single monolayer of graphene disposed on the substrate and having a lateral dimension. The monolayer of graphene is characterized by a height variation of less than $5.0 \times 10^{-2}$ nm per unit area of the lateral dimension.

According to an alternative embodiment of the present invention, a nano-switch is provided. The nano-switch includes a substrate and at least one cavity or at least one nano-dot disposed in the substrate. The nano-switch also includes a graphene monolayer coupled to the substrate and overlying the at least one cavity or at least one nano-dot and an electron source coupled to the substrate and the graphene layer. The electron source is configured to inject electrons into the graphene layer. The nano-switch further includes a plurality of electron sinks coupled to the graphene sheet. The plurality of electron sinks are configured to receive ballistic electrons passing through the graphene layer.

Numerous benefits are achieved by way of the present invention over conventional techniques. For example, embodiments of the present invention provide techniques that utilize a one-step, low-temperature PECVD process for rapidly producing large-area graphene with superior quality. This scalable process eliminates technological limitations imposed by thermal CVD processes, making it amenable for integration with complementary materials (e.g., CMOS processes) and technology.

Additionally, the low-temperature (LT)-grown graphene formed using plasma enhanced chemical vapor deposition (PECVD) exhibits a number of unique and excellent properties, including: nearly strain-free graphene sheets over a large area; atomic flatness and excellent crystalline structures over a large area; mechanical integrity upon transfer from the growth copper substrate to other surfaces; a one-step fast growth process (e.g., within <5 minutes) that is compatible with device fabrication processes; excellent electrical mobility (>60,000 $cm^2$/V-s); and large grain sizes (typically >100 µm, for example ~250-300 µm in length). These and other embodiments of the invention along with many of its advantages and features are described in more detail in conjunction with the text below and attached figures.

BRIEF DESCRIPTION OF THE DRAWINGS

FIGS. 9A-9E illustrates Moire patterns for graphene as a function of angle according to an embodiment of the present invention.

FIGS. 9F-9J illustrates Fourier Transforms for the Moire patterns in FIGS. 9A-9E.

FIG. 13A is a plot illustrating representative sheet resistance vs. gate voltage (V) data for an LT-grown graphene sample according to an embodiment of the present invention.

FIG. 13B is a conductivity vs. sheet carrier density ($n_s$) plot converted from the data illustrated in FIG. 13A.

DETAILED DESCRIPTION OF SPECIFIC EMBODIMENTS

An approach that has been used to grow graphene films is PECVD, which has been a standard method for depositing carbon films, most notably diamond. The plasma provides a rich chemical environment, including a mixture of radicals, molecules and ions from a hydrogen-hydrocarbon feedstock. Unlike thermal CVD, PECVD deposition is achieved through reactive species rather than solely thermal catalysis, thereby enabling lower deposition temperatures. However, the quality of PECVD-grown graphene using conventional techniques is only modestly comparable to that of thermal CVD.

In order to improve the quality of the graphene films in comparison with conventional graphene films, embodiments of the present invention utilize a single-step PECVD process for graphene growth that overcomes issues of both quality and temperature while retaining scalability: A hydrogen plasma containing nitrogen and methane was used to simultaneously produce an atomically smooth copper surface and deposit graphene. Copper etching is achieved by CN radicals in the plasma, which etch copper at room temperature. Graphene deposition is achieved by a competitive process between simultaneous carbon deposition by methyl radicals and etching of amorphous carbon by atomic hydrogen.

Figure 1:
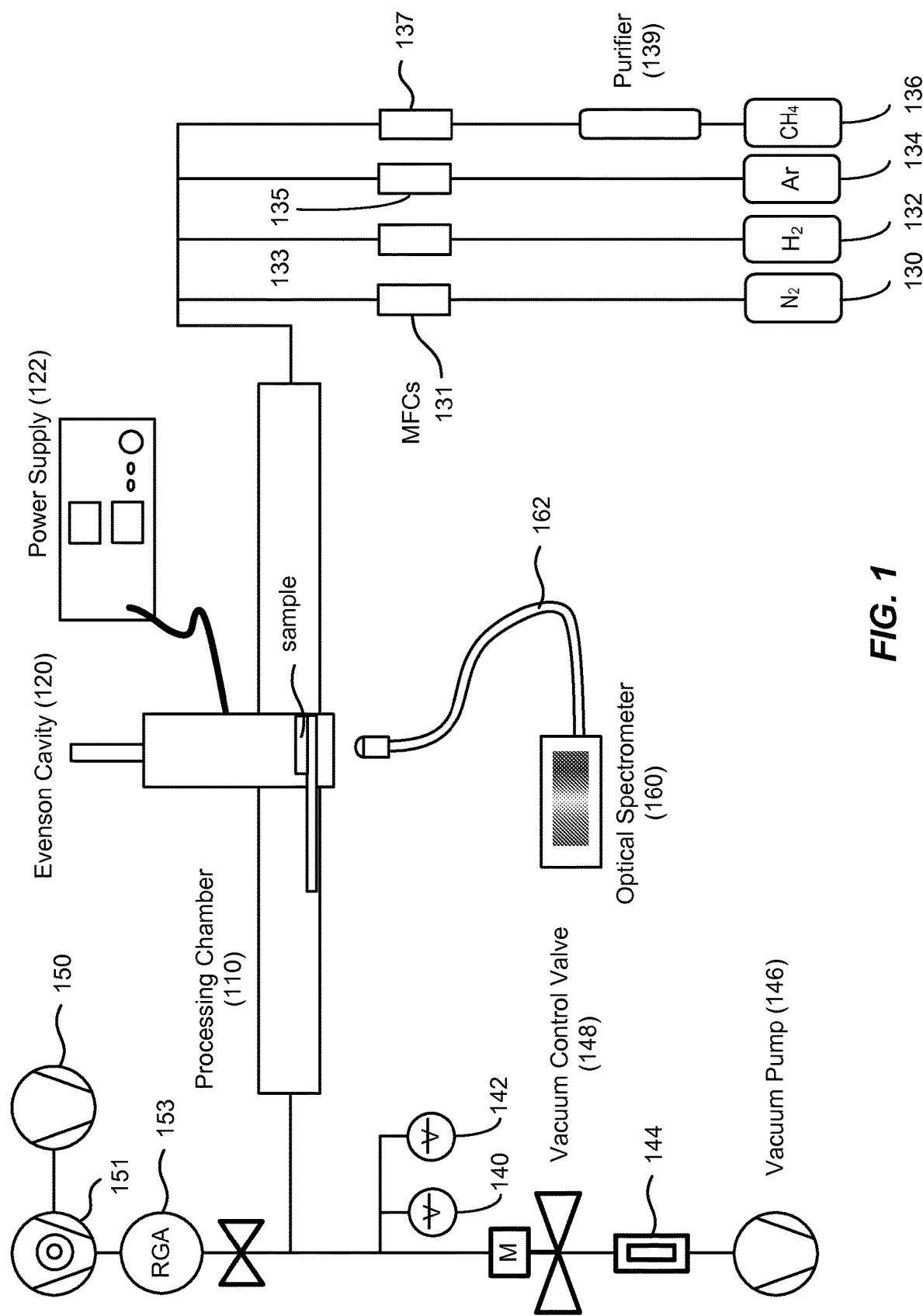
FIG. 1 is a simplified schematic diagram of a system for producing graphene according to an embodiment of the present invention.

FIG. 1 is a simplified schematic diagram of a system for producing graphene according to an embodiment of the present invention. The system includes several main components, namely plasma, vacuum, and gas delivery systems. The system includes a processing chamber 110. The processing chamber can also be referred to as a processing tube. The processing chamber is fabricated from materials such as quartz that provide a non-reactive environment that will sustain plasma generation. In addition to quartz, other materials, including alumina, glass, and the like can be utilized in fabricating the processing chamber. In a particular embodiment, the processing chamber is a quartz tube with an inner diameter of 10 mm and an outer diameter of 12.5 mm.

A microwave plasma generator 120 (e.g., an Evenson cavity suitable for generating a microwave plasma), which is mated to the processing tube, and an associated power supply 122 are provided in order to generate a microwave plasma (e.g., a microwave plasma in the ultra high frequency (UHF) portion of the RF spectrum) in a portion of the processing chamber. In a particular embodiment, the exciting frequency is 2450 MHz. The portion of the processing chamber can include all or a fraction of the processing chamber depending on the particular implementation.

Gas sources 130, 132, 134 and 136 are illustrated in FIG. 1 and can include fewer or a greater number of sources. In the illustrated embodiment, the gas sources are $H_2$, (130) and $N_2$ (132), which are used as a cleaning gas, $CH_4$, (136) as the carbon source or precursor, and Ar (132) as a carrier gas and for use in backfilling the processing chamber after growth, although the present invention is not limited to these particular gases. Mass flow controllers (MFCs) 131, 133, 135, and 137 or other suitable flow controllers are utilized to control the flow rate of the gases from the gas sources to the processing chamber. In an alternative embodiment, a bakeable variable leak valve can be used between the carbon source 136 and the corresponding MFC 137 as well as a bakeable variable leak valve between the nitrogen source 130 and the corresponding MFC 131. An optional purifier 139 can be placed before the MFC 137 on the carbon source line. Quarter-turn, shut-off valves (not shown) can be placed directly after each of the MFCs. The system pressure and gas flows are monitored and controlled through the controller via software interface. A residual gas analyzer (RGA) 153 is used to sample the exhaust gas.

As illustrated in FIG. 1, MFCs 130, 132, 134, and 136 are used to control the flow of the gases and the flow of the gases can be controlled using a feedback loop incorporating a feedback signal from optical spectrometer 160. Alternatively, a pre-mixture of $H_2$ and $CH_4$ (or other suitable carbon source) could be utilized. Accordingly, some embodiments utilize the optical emission spectra to adjust the amount of the various gases including nitrogen, hydrogen, and/or carbon in the stream since the optical emission spectra can be sensitive to very small changes in the flow rate of the gases.

In order to monitor the pressure in the processing chamber 110, one or more pressure gauges 140 and 142 can be utilized in the vacuum lines leading to the foreline trap 144 and the vacuum pump 146. Additional vacuum elements can be utilized as appropriate to the particular application. As an example, vacuum components can include a mechanical roughing pump 150, a turbo pump 151, a cryogenic pump, or a sorption pump. Additionally, one or more vacuum control valves 148 can be utilized to control the pressure in the processing chamber.

In order to provide for characterization of the processing environment and the graphene formation process, an optical spectrometer 160 is provided, illustrated as optically coupled to the processing chamber using a fiber optic cable 162. In addition to optical emission spectrometers (OES), which can be used to control and adjust the amount of the hydrogen, nitrogen, and/or carbon in the flow stream, the OES can be used to measure the emission peaks. In some embodiments, a ratio of a set of emission peaks can be used to monitor the growth process and produce consistent results. In other implementations, an optical pyrometer is used to measure the sample temperature. In some embodiments, an optical inspection system (for example, a mirror or a video camera that provides optical access to one or more surfaces of the substrate) is utilized during growth to characterize the state of copper removal. Thus, in addition to an optical spectrometer, other optical inspection techniques are included within the scope of the present invention.

As discussed above, some embodiments utilize a low-power (e.g., ranging from 10 W to 40 W) Evenson cavity as the plasma source to form a cold hydrogen/nitrogen plasma over the substrate (e.g., copper). The graphene deposition process involved directly exposing the copper substrates to the hydrogen/nitrogen plasma containing a carbon precursor. Removal of Cu was found to accompany graphene growth. Thus, exposure of the substrates to the plasma enabled concurrent etching, cleansing, and smoothing of the substrate surface during the graphene growth process. In some embodiments, to prevent the copper substrate from releasing trapped air that leads to undesirable and sometimes uncontrollable gas compositions during the graphene growth process, the copper substrates were annealed in a vacuum environment at 300° C. for a predetermined period (e.g., one to two hours) before use in the graphene growth process.

Copper deposits were found on both the front and back sides on the processing chamber and sample holder for each successful growth as the result of plasma etching of the copper substrates. In contrast, runs with little copper removal did not produce optimal films. The maximum temperature in the center of plasma was 160° C. (425° C.) at 10 W (40 W), which decayed by more than 120° C. (250° C.) within ~1 cm from the center. The effective temperature of the copper substrate stayed below the plasma temperature due to the continuing flow of room temperature hydrogen gas and the distance from the center of the plasma. Typically after ~5 minutes of direct exposure to the plasma, a large-area monolayer graphene formed on the backside of copper substrates while the front side of the substrates was coated with multilayer graphene. Upon the completion of graphene growth, the plasma was extinguished, and the gas flows were stopped. The processing chamber was then evacuated and back filled with Ar, and the substrate with graphene coating was subsequently removed.

Using embodiments of the present invention, more than 200 high-quality large-area graphene were reproducibly fabricated by PECVD growth within 5~15 minutes in a single step without active heating. The fully graphene-covered sample size was (8×13) $mm^2$~1 $cm^2$, which is scalable in a larger cavity by applying the same or similar growth conditions.

Graphene growth was performed on a variety of copper substrates, including high purity copper foil, common OFHC sheet, single crystal (100) copper substrates, and single crystal (111) copper substrates. Gas chromatography (using an HP 5890 II employing a flame ionization detector (FID)) was used to measure the amount of methane in the hydrogen stream during graphene growth.

Figure 2:
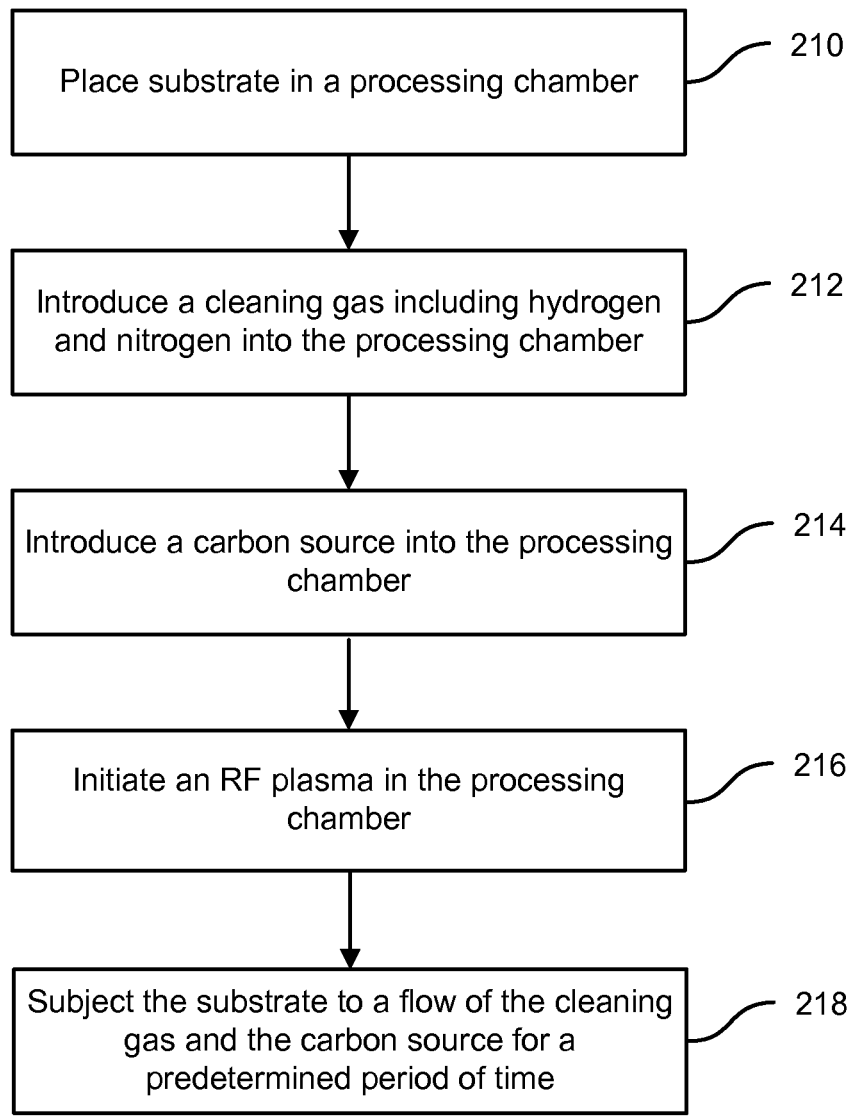
FIG. 2 is a simplified flowchart illustrating a method of producing graphene according to an embodiment of the present invention.

FIG. 2 is a simplified flowchart illustrating a method of producing graphene according to an embodiment of the present invention. The method includes placing a substrate (e.g., a copper foil (e.g., 0.025 mm in thickness) or a copper single crystal (100) or (111) substrate) in a processing chamber (210). In an embodiment, the processing chamber is a quartz tube with an inside diameter of 10 mm and an outside diameter of 12.5 mm. In some embodiments, the method also includes placing the processing chamber under vacuum, for example, a pressure less than or equal to 500 mTorr. A flow of a cleaning gas including hydrogen and nitrogen (e.g., atomic hydrogen and cyano radicals) is introduced into the processing chamber, for example, a flow rate of $H_2$ of between 2 sccm and 5 sccm, for example, 2 sccm, and a nitrogen concentration less than 200 ppm (212). A flow of a carbon source (e.g., methane), also referred to as a carbon precursor, is added to the flow of the cleaning gas, for example, a concentration of $CH_4$ of 4000 ppm (i.e., 0.4% methane concentration) (214). The pressure in the processing chamber is stabilized at a predetermined value, for example, less than or equal to 500 mTorr, and the method includes initiating a microwave plasma in the processing chamber (216), using, for example, an input power of 10-40 W using an Evenson cavity as discussed above, which can create the microwave plasma in the vicinity of the substrate. In some embodiments, the amount of the carbon source is a small fraction of the cleaning gas flow, for example, less than 0.6%, for example, between 0.01% and 0.6%. In some implementations, the amount of the carbon source is greater than 100 ppm. Thus, some embodiments of the present invention provide a microwave plasma of hydrogen containing trace amounts of methane as a carbon source.

In addition to Evenson cavities, other plasma sources can be utilized according to embodiments of the present invention, for example, inductively coupled plasma sources or the like. The gases in the plasma can also be varied, for example, a plasma including argon ions, a plasma including chlorine ions and methane-based radicals, combinations thereof, such as chlorine, argon, and methane, and the like. Moreover, heated wire (e.g., hot wire) filament techniques can be used to create reactive species suitable for graphene growth in a process analogous to the plasma-based graphene growth techniques discussed herein. Combinations of plasma techniques and heated wire filament techniques are also included within the scope of the present invention.

In addition to the use of hydrogen and nitrogen as the cleaning gas, other gases can be utilized, including argon, other noble gases, chlorine, other halogens, mixtures of these gases (e.g., chlorine and argon), and the like. In addition to the use of methane as the carbon source, other gases can be utilized, including acetylene (ethyne, $C_2H_2$), 2,2-dimethylpropane (neopentane, $C_5H_{12}$), allene (propadiene—$C_3H_4$), ethane ($C_2H_6$), 1,2-butadiene ($C_4H_6$), ethyl acetylene (1-butyne—$C_4H_6$), 1,3-butadiene ($C_4H_6$), ethylene (ethene—$C_2H_4$), isobutane (2-methylpropane—$C_4H_{10}$), n-hexane ($C_6H_{14}$), n-butane ($C_4H_{10}$), 1-butene ($C_4H_8$), methyl acetylene (propyne—$C_3H_4$), cis-2-butene ($C_4H_8$), isopentane (2-methylbutane or 3-methylbutane—$C_5H_{12}$), trans-2-butene ($C_4H_8$), n-pentane ($C_5H_{12}$), isobutylene (2-methylpropane—$C_4H_8$), propane ($C_3H_8$), cyclopropane ($C_3H_6$), propylene (propene—$C_3H_6$), dimethylacetylene (2-butyne—$C_4H_6$), toluene ($C_7H_8$), dimethyl ether ($C_3H_6O$), vinyl acetylene, or the like. It should be noted that CO and $CO_2$ can also be used as precursors since CO is produced in the plasma and is then consumed in the growth process.

The method further includes subjecting the substrate to the microwave plasma for a predetermined period of time, for example, 5 minutes (218), during which the flow of the cleaning gas including hydrogen and nitrogen and the carbon source are continued while still operating at a reduced pressure. In some embodiments, a fan or other cooling device (e.g., flowing air cooled by flowing through a tube having liquid nitrogen) was applied to the region of the processing tube in which the microwave plasma is formed, reducing the temperature of the processing environment, for example, to temperatures less than room temperature. As an example, such cooling can reduce the temperature of the outside of the processing chamber (i.e., the quartz tube) to 90° C. or other comparable temperatures. Thus, embodiments of the present invention may refer to room temperature growth of the graphene film, but the present invention is not specifically limited to growth at 24° C., but can include other comparable temperatures. Thus, room temperature, for the purposes of this disclosure, is intended to include processing environments in which there is no external heating of the substrate other than heat that can be generated as a result of the microwave plasma process. In fact, as discussed above, cooling of the substrate and the region of the processing chamber adjacent the substrate can be used to remove a portion or all of the heat generated during the microwave plasma process.

After formation of the graphene layer, the plasma is extinguished, the processing chamber is back-filled with argon to atmospheric pressure, and the substrate is removed from the processing chamber. The inventor has noted that a the process illustrated in FIG. 2, a significant amount of copper is observed in the vicinity of the microwave cavity as a consequence of the microwave plasma removing the native copper oxide layer originally present on the substrate surface.

In the method illustrated by FIG. 2, the concurrent flow of the cleaning gas including hydrogen and nitrogen as well as the carbon source gas creates reactive species (e.g., atomic hydrogen, cyano radicals, and reactive carbon species such as $C^+$, $CH^+$, $CH_2^+$, and $CH_3^+$) in the plasma. These reactive species act as a cleaning gas to remove native species on the substrate and etch copper as well as depositing graphene on the substrate as the simultaneous removal of copper oxide and the deposition of graphene occurs. It should be noted that the cleaning gas not only cleans the substrate but also smoothes the substrate surface in some embodiments. Additionally, in some embodiments, the presence of atmospheric gases, e.g. $N_2$, $O_2$, $CO_2$, Ar, and the like as well as atmospheric water with a total base pressure in the chamber below 50 mTorr is utilized according to the present invention. In this case, the base pressure is the pressure before the actual process gases such as $CH_4$, $H_2$, and $N_2$ are added to the chamber. Thus, embodiments of the present invention include the use of residual atmospheric nitrogen in the chamber during the graphene growth process.

Figure 4A:
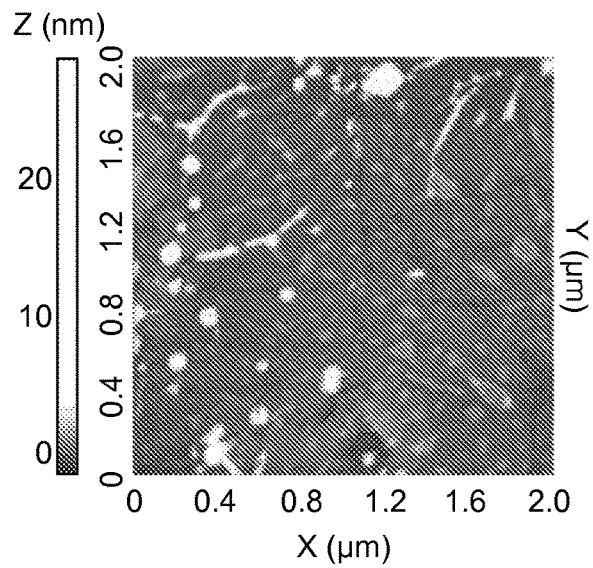
FIGS. 4A-4C are atomic force microscopy images of graphene according to an embodiment of the present invention.
Figure 4B:
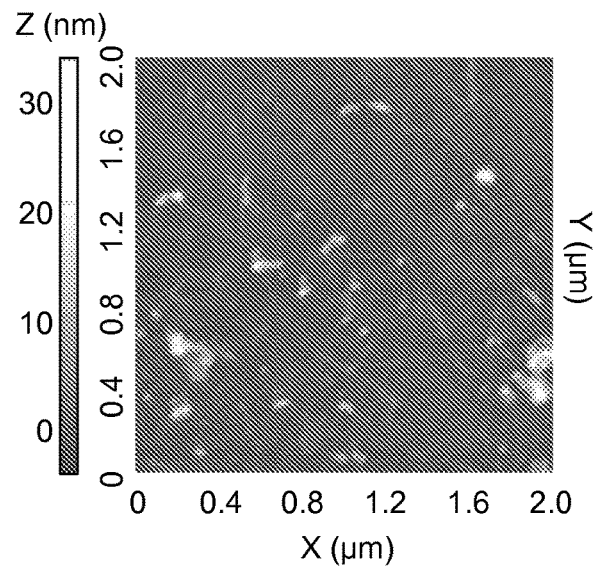
Figure 4C:
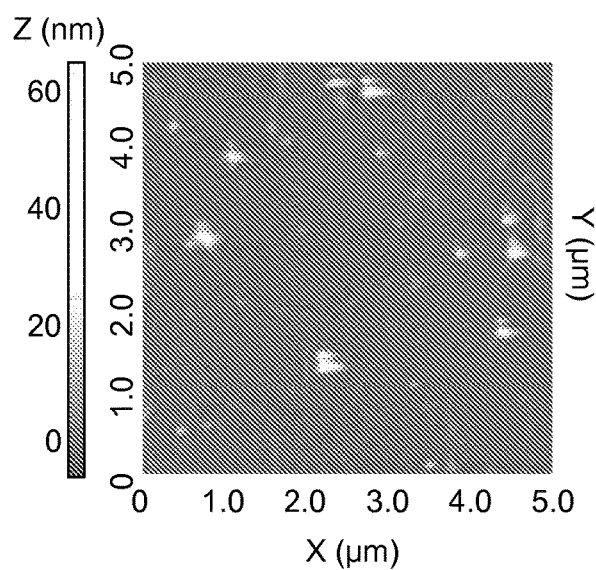
Figure 4D:
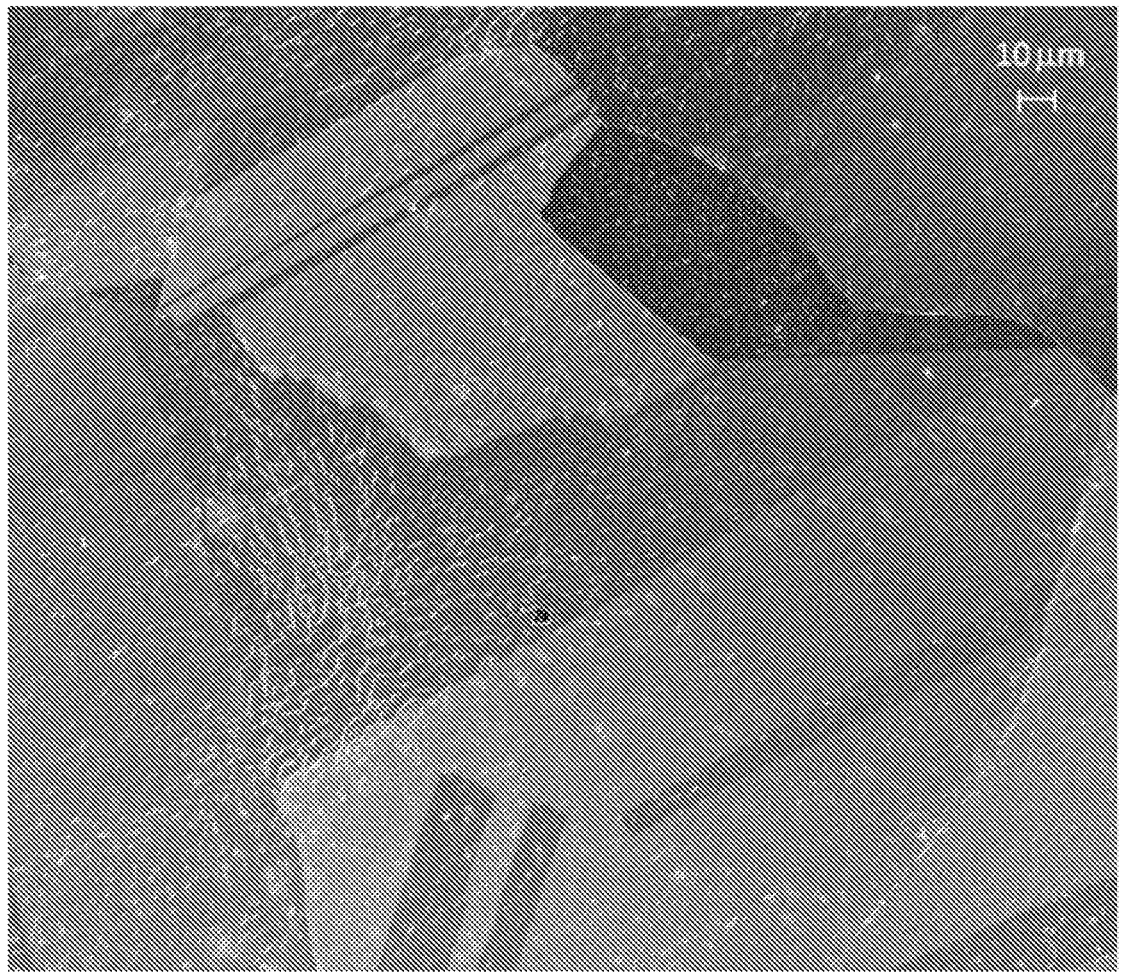
FIG. 4D is a scanning electron microscopy (SEM) image of a monolayer LT-graphene on polycrystalline Cu foil according to an embodiment of the present invention.
Figure 4E:
FIG. 4E is an SEM image of a monolayer of LT-graphene on polycrystalline Cu foil according to an embodiment of the present invention.

FIG. 4E is an SEM image of a monolayer of LT-graphene on polycrystalline Cu foil according to an embodiment of the present invention. The SEM image illustrated in FIG. 4E was taken at a bias voltage of 5 kV. At this voltage, the grains of copper are revealed to be on the order of hundreds of microns. The scale bar on the bottom corresponds to 100 µm. In comparison with copper prior to LT-graphene growth, which is characterized by a rough surface and no visible grains, embodiments of the present invention not only clean and smooth the copper surface, the process enlarges the grains as well. Moreover, in contrast high temperature annealing, which can etch anisotropically and, therefore, produces a striated and rough surface, embodiments of the present invention produce a nearly atomically flat copper surface that provides a proper substrate flatter and better graphene than produced in conventional methods.

It should be appreciated that the specific steps illustrated in FIG. 2 provide a particular method of producing graphene according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 3:
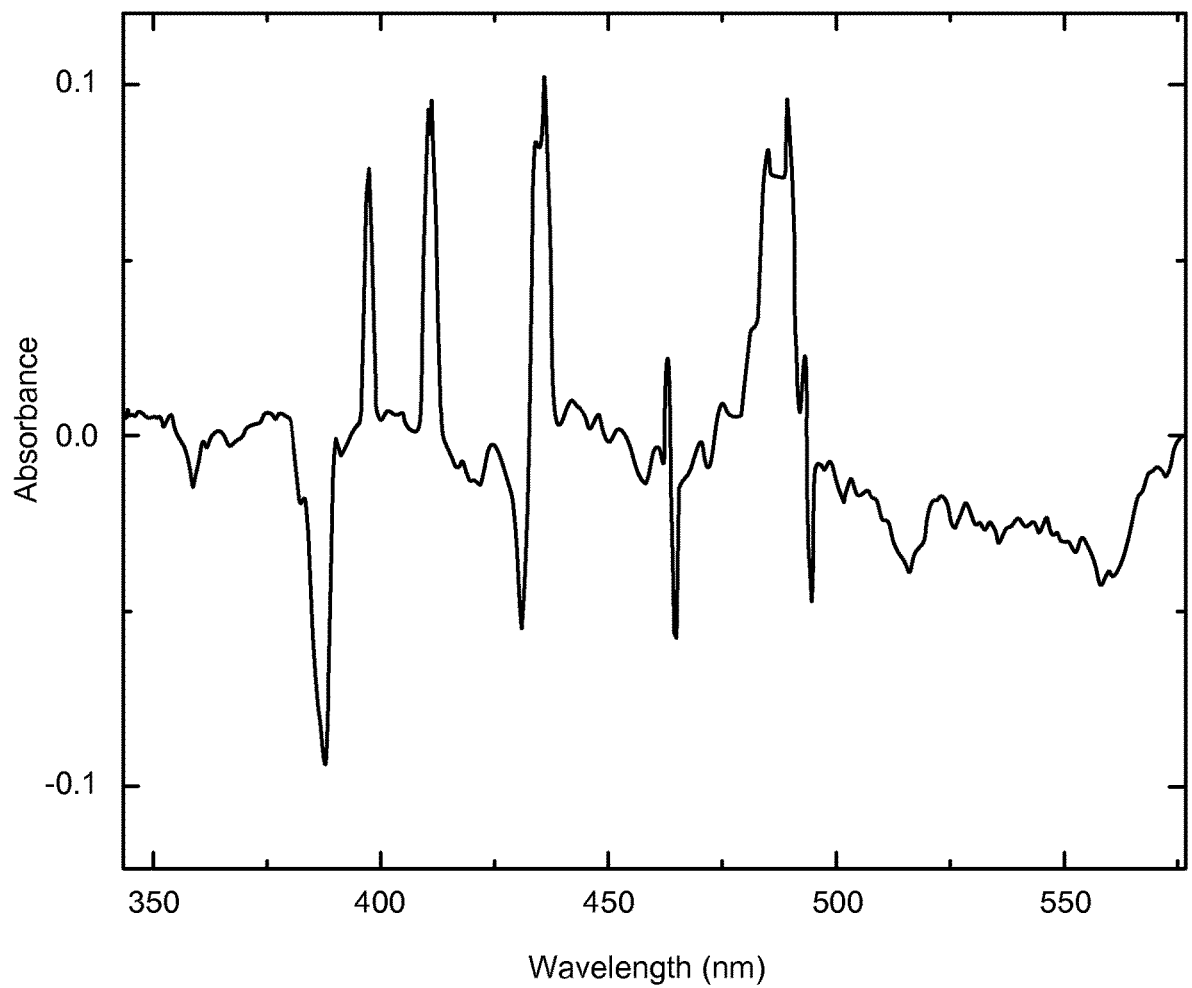
FIG. 3 is a plot illustrating an emission spectrum of a plasma during graphene formation according to an embodiment of the present invention.

FIG. 3 is a plot illustrating an emission spectrum of a plasma during graphene formation according to an embodiment of the present invention. The optical emission spectra of the plasma illustrated in FIG. 3 was measured using a fiber coupled spectrometer (S2000 available from Ocean Optics, Inc.) that was placed directly below the plasma generator. Absorption spectra were taken prior to graphene deposition away from the area of the copper sample. The spectra were referenced to a pure hydrogen plasma, i.e., before the addition of the flow of methane. As illustrated in FIG. 3, the spectrum includes negative absorption peaks that indicate an increase in a component and positive peaks that indicate a decrease. It should be noted that a peak associated with an increase in the cyano (CN) radical is observed at 388 nm.

The inventors believe, without limiting embodiments of the present invention, that atomic hydrogen and CN radicals are the plasma species acting upon copper during the PECVD graphene growth process. Atomic hydrogen is produced via the hydrogen plasma and removes native atmospheric derived species including $Cu_2O$, CuO, $Cu(OH)_2$, and $CuCO_3$. The CN radicals are highly reactive with and remove copper during the etching process. In order to characterize the impact of the amount of nitrogen present in the system, we increased the nitrogen flow and found that the PECVD growth occurred at half the normal plasma power. Conversely, under excess methane conditions the copper substrate would not etch at even more than double the normal plasma power. Thus, the presence of both atomic hydrogen and CN radicals in the plasma enables the concurrent (e.g., simultaneous) preparation of the copper surface and deposition of high quality graphene at reduced temperatures. In addition to CN radicals, other nitrogen oxides, nitrogen oxide radicals, carbon oxides, and/or carbon oxide radicals (e.g., CO, CH, CN, NO, and the like) can be present in the chamber during growth and provide reactive functionality.

To verify the quality of LT-grown graphene and to compare with thermal CVD-grown graphene, we performed studies of STM, AFM, SEM, Raman spectroscopy and electrical mobility for microscopic and macroscopic characterization.

FIGS. 4A-4C are atomic force microscopy (AFM) images of graphene according to an embodiment of the present invention. For the AFM images illustrated, the LT-grown graphene films were annealed in air (e.g., for 30 minutes) after the graphene film was transferred from the substrate to an $SiO_2$ substrate, resulting in oxidation and diminishment of the grain boundaries. Hence, AFM analysis of the air-annealed sample height as a function of the lateral dimensions provides direct information about the domain sizes.

FIG. 4A illustrates grain boundaries (highlighted in dashed lines for clarity) joining three grains over a (2×2) $\mu m^2$ area, indicating that the lateral size of the three connecting grains was >2 µm. In contrast, FIGS. 4B and 4C illustrate the common observation in which no grain boundaries were visible over (2×2)$\mu m^2$ and even up to the maximum (5×5)$\mu m^2$ scanning area of the AFM, suggesting that the lateral dimension of most grains was larger than 5 µm. These grain sizes of LT-grown graphene are much larger than the typical grain size of ~0.1 µm for conventional thermal CVD-grown graphene at 1000° C.

Thus, the AFM measurements of the grain sizes of LT-grown graphene on Cu foil revealed a lateral domain size mostly larger than 5 µm, which was more than $10^3$ times larger in areas than those of conventional CVD-grown graphene. This finding was corroborated by subsequent measurements using SEM, which revealed apparent grain sizes generally larger than 100 µm in the lateral dimension as exemplified by the SEM image of a monolayer of LT-graphene on copper foil as illustrated in FIG. 4D. Moreover, unlike the fragile monolayer films produced by thermal CVD at 1000° C., each ~1 $cm^2$ LT-grown graphene sheet remained fully intact upon removal from Cu substrates, which demonstrates excellent mechanical integrity.

FIG. 4D is a scanning electron microscopy (SEM) image of a monolayer LT-graphene on polycrystalline Cu foil according to an embodiment of the present invention. The SEM image illustrated in FIG. 4D was taken at a bias voltage of 1 kV. The scale bar on the upper right corner corresponds to 10 µm. The monolayer nature of the LT-graphene shown in this image has been independently verified by Raman spectroscopy.

Figure 5A:
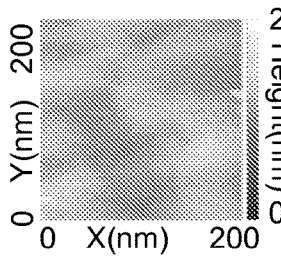
FIG. 5A-5L are surface topography maps for graphene according to an embodiment of the present invention.
Figure 5B:
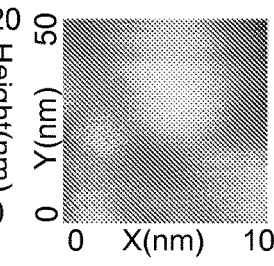
Figure 5C:
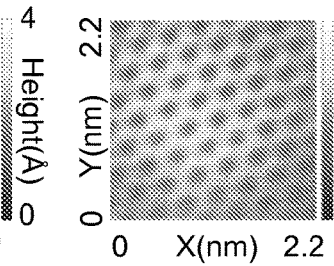
Figure 5M:
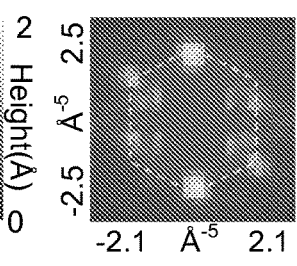
FIGS. 5M-5P are Moire patterns associated with the topography maps shown in FIGS. 4A-4D, respectively.
Figure 5D:
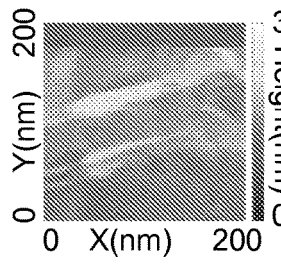
Figure 5E:
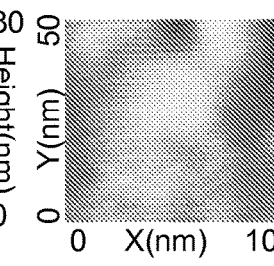
Figure 5F:
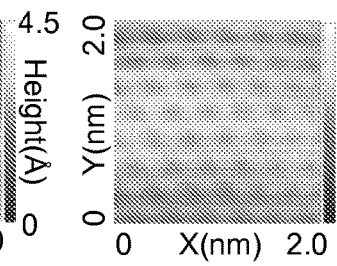
Figure 5N:
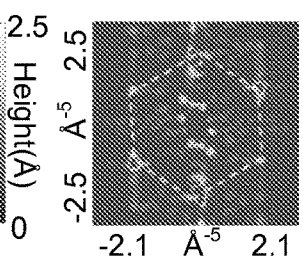
Figure 5G:
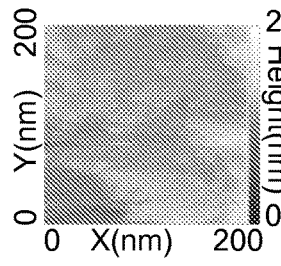
Figure 5H:
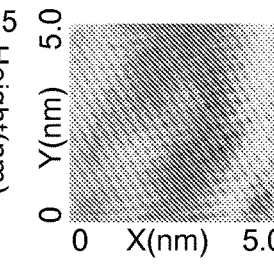
Figure 5I:
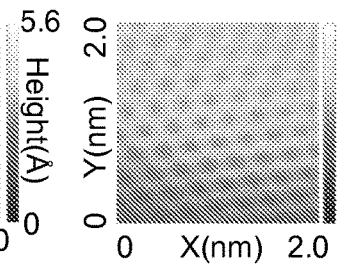
Figure 5O:
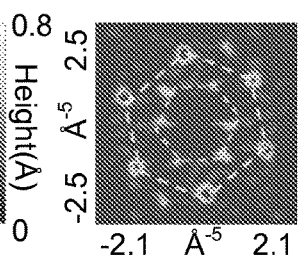
Figure 5J:
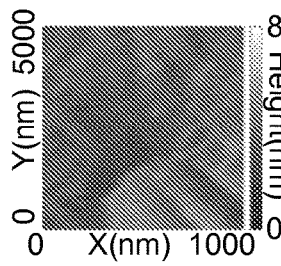
Figure 5K:
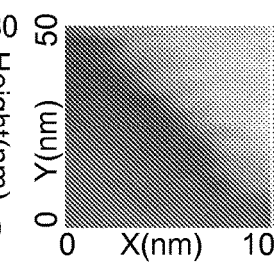
Figure 5L:
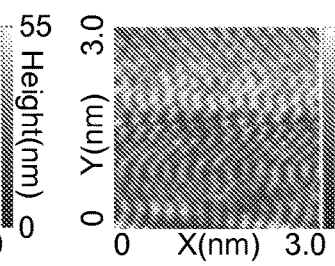
Figure 5P:
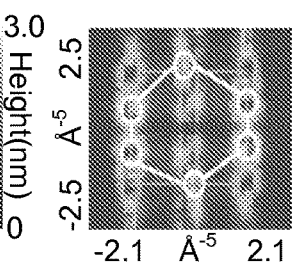

FIG. 5A-5P are surface topography maps for graphene according to an embodiment of the present invention. These images show representative microscopic structures taken at 77 K of graphene grown at different temperatures and on different substrates.

As exemplified in FIGS. 5A-5I, STM images of LT-grown graphene on substrates of Cu foil (FIG. 5A-5C), Cu (100) (FIG. 5D-5F), Cu (111) (FIG. 5G-5I), and 1000° C.-grown graphene on Cu foil (FIG. 5J-5L) over successively decreasing length scales (0-200 nm in FIGS. 5A, 5D, 5G, and 0-1,000 nm in FIG. 5J; 0-10 nm in FIGS. 5B and 5E, 05 nm in FIG. 5H, and 0-10 nm in FIG. 5K; 0-2.2 nm in FIG. 5C, 0-2 nm in FIGS. 5F, 5I, and 0-3 nm in FIG. 5L). As illustrated in these figures, all LT-grown graphene exhibited much better ordered honeycomb structures and smoother surface morphology. In contrast, the 1000° C.-grown graphene generally exhibited severe lattice distortions and large corrugations in heights.

FIGS. 5M-5P are Moire patterns associated with the topography maps shown in FIGS. 5A-5L, respectively. The degree of ordering in the lattice structure was further manifested by the Fourier transformation (FT) of STM topographies, as exemplified in FIGS. 5M-5P. The FT spectra demonstrated dominantly hexagonal lattices for all LT-grown graphene as illustrated in FIGS. 5M-5O, whereas thermal CVD-grown graphene on Cu revealed severe structural distortion as illustrated in FIG. 5P. FIGS. 9A-9E illustrates Moire patterns for graphene as a function of angle according to an embodiment of the present invention. FIGS. 9F-9J illustrates Fourier Transforms for the Moire patterns in FIGS. 9A-9E. As illustrated in these figures, LT-grown graphene on Cu single crystals exhibited Moiré patterns, as manifested by the second set of smaller Bragg diffraction peaks in addition to the hexagonal Bragg peaks of graphene. In the case of graphene on Cu (111) hexagonal lattice, the Moiré pattern formed ~(6±2°) relative to the honeycomb lattice. In contrast, the inventors have observed that the Moiré pattern of graphene on the square lattice of Cu (100) was incommensurate with the honeycomb structure and was revealed by a parallelogram at approximately an angle ~(12±2°) relative to the honeycomb lattice as illustrated in FIGS. 9F-9J.

Thus, LT-grown graphene films exhibited highly ordered honeycomb structures over extended areas, in contrast to the strong structural distortion commonly associated with the 1000° C.-grown graphene on Cu foils.

The effects of growth conditions on strain may be further corroborated microscopically by analyzing the local two-dimensional displacement field $u=u_x\hat{x}+u_y\hat{y}=r-r_0$, where r and $r_0$ denote the actual position of a carbon atom and its equilibrium position in ideal graphene, respectively. The compression/dilation strain is given by $(\partial u_x/\partial x)+(\partial u_y/\partial y)\equiv u_{xx}+u_{yy}$, which is proportional to the biaxial strain and also responsible for local charging effects. Using the topographies shown in FIGS. 5A-5L, we obtained the corresponding strain maps at 77 K illustrated in FIGS. 8A/8B, 8C/8D, 8E/8F, and 8G/8H discussed below.

Figure 6A:
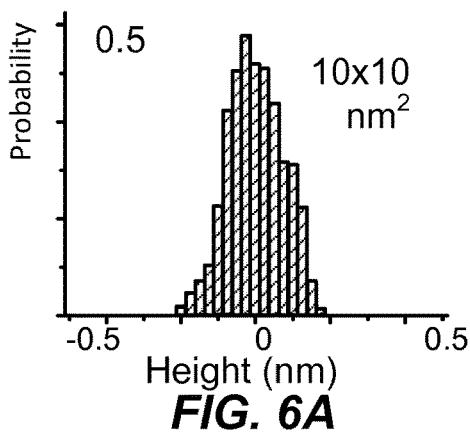
FIGS. 6A-6H are height histograms for graphene over differing areas according to an embodiment of the present invention.
Figure 6B:
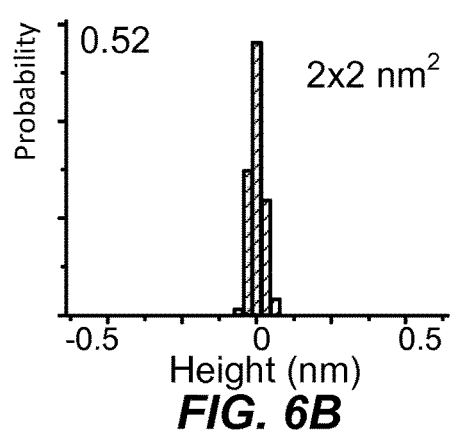
Figure 6C:
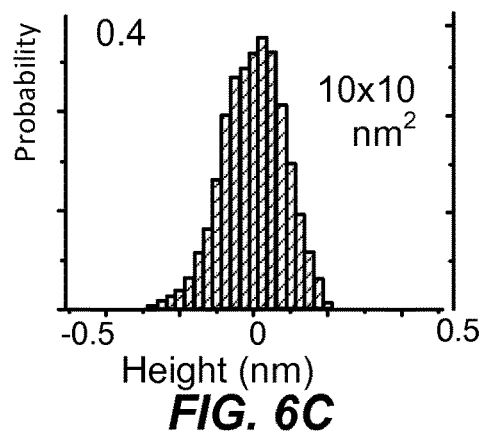
Figure 6D:
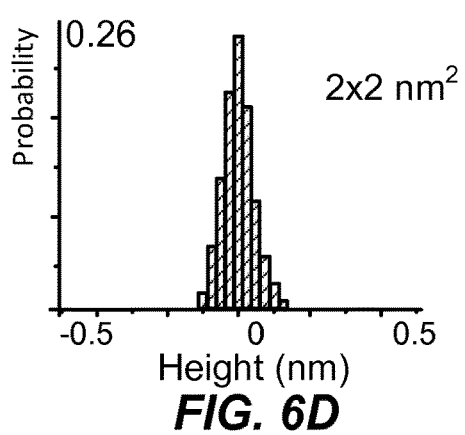
Figure 6E:
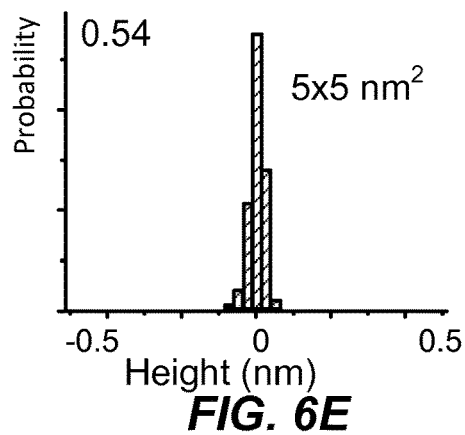
Figure 6F:
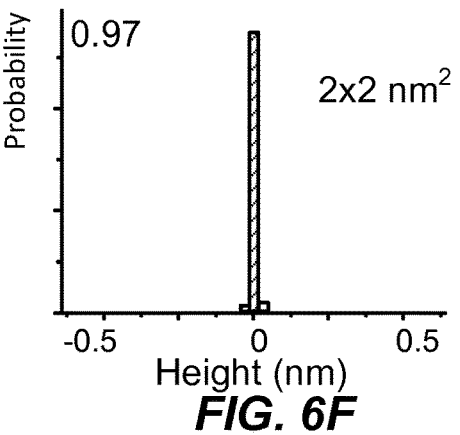
Figure 6G:
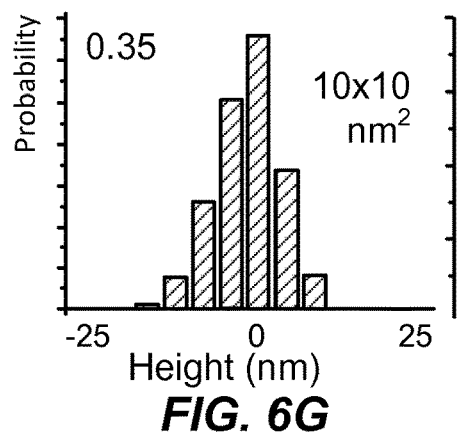
Figure 6H:
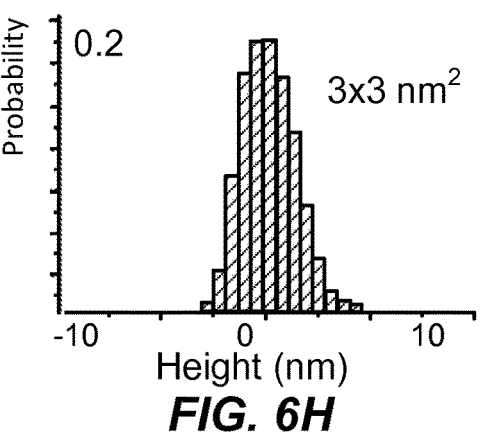

FIGS. 6A-6H are height histograms for graphene over differing areas according to an embodiment of the present invention, where the y-axis represents the probability of a given height for the corresponding height reading in the x-axis. FIGS. 6A and 6B are height histograms for LT-grown graphene on a polycrystalline foil measured over an area of 10×10 nm² and an area of 2×2 nm², respectively. FIGS. 6C and 6D are height histograms for LT-grown graphene on a Cu single crystal (100) substrate measured over an area of 10×10 nm² and an area of 2×2 nm², respectively. FIGS. 6E and 6F are height histograms for LT-grown graphene on a Cu single crystal (111) substrate measured over an area of 5×5 nm² and an area of 2×2 nm², respectively. FIGS. 6G and 6H are height histograms for 1000° C.-grown graphene on a polycrystalline foil measured over an area of 10×10 nm² and an area of 3×3 nm², respectively.

As illustrated in FIGS. 6A-6H, the overall surface morphology for LT-grown graphene is much smoother than that of the 1000° C.-grown graphene at all length scales, as exemplified by the height histograms over successively decreasing areas in each of FIGS. 6A-6F. In particular, the measurement areas are characterized by a lateral dimension (e.g., 10 nm×10 nm). Over this lateral dimension, for the LT-grown graphene, the height variation is less than 10% of the lateral area. As an example, for FIG. 6A, the lateral area is 100 nm² and the height variation at the half-height linewidth is ~0.2 nm, resulting in a height variation $0.2\times10^{-2}$ nm per unit area (in nm²). The values for the other LT-grown graphene are:

FIG. 6B—Height variation of 0.05 nm over 4 nm², or equivalently $1.25\times10^{-2}$ nm per nm²

FIG. 6C—Height variation of 0.2 nm over 100 nm², or equivalently $0.2\times10^{-2}$ nm per nm²

FIG. 6D—Height variation of 0.1 nm over 4 nm², or equivalently $2.5\times10^{-2}$ nm per nm²

FIG. 6E—Height variation of 0.025 nm over 25 nm², or equivalently $1.0\times10^{-2}$ nm per nm²

FIG. 6F—Height variation of <0.01 nm over 4 nm², or equivalently $<0.25\times10^{-2}$ nm per nm²

Thus, in embodiments of the present invention, the LT-grown graphene on all substrates is characterized by a height variation ranging from $<\sim0.25\times10^{-2}$ to $2.5\times10^{-2}$ nm per nm² over all measurement areas. In contrast with these small values of height variation per unit area, the 1000° C.-grown graphene is characterized by a height variation from $15.0\times10^{-2}$ nm per nm² (i.e., 15 nm variation over an area of 100 nm²) to $111.0\times10^{-2}$ nm per nm² (i.e., 10 nm variation over and area of 9 nm²). Thus, the height variations of thermal CVD-grown graphene are found to be typically one to two orders of magnitude larger than those of LT-graphene.

Figure 7A:
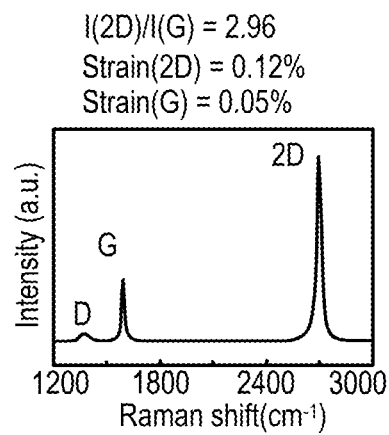
FIGS. 7A-7L are Raman spectra for graphene illustrating spatial strain according to an embodiment of the present invention.
Figure 7B:
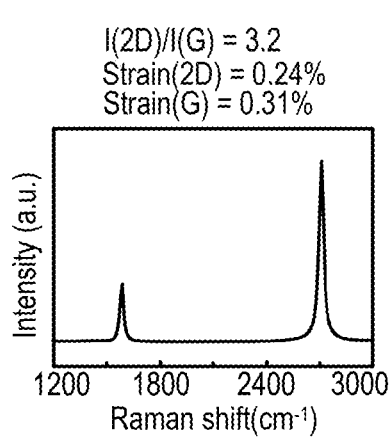

FIGS. 7A-7L are Raman spectra for graphene illustrating spatial strain according to an embodiment of the present invention. Referring to FIG. 7A, a Raman spectra for LT-grown graphene on a polycrystalline foil is illustrated. The D peak is associated with the D-band phonon mode in Raman spectroscopy due to the presence of edge states in the film, the G peak is associated with the G-band (at the zone center of graphene in the reciprocal space) in the film, and the 2D peak is associated with the 2D-band mode for the monolayer of graphene. In the case of polycrystalline Cu foils, the grain size is often limited by the grain boundaries, which also result in slight strain variations and the occasional appearance of the D peak, as exemplified in FIG. 7A. FIG. 7B is a Raman spectra for 1000° C.-grown graphene on a polycrystalline foil.

Figure 7C:
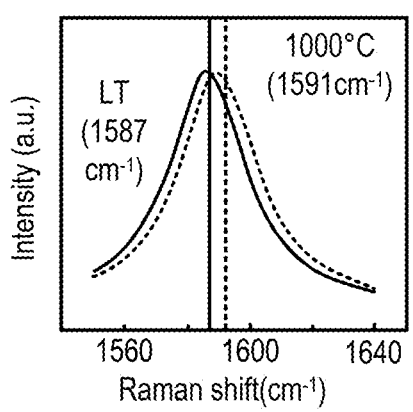
Figure 7D:
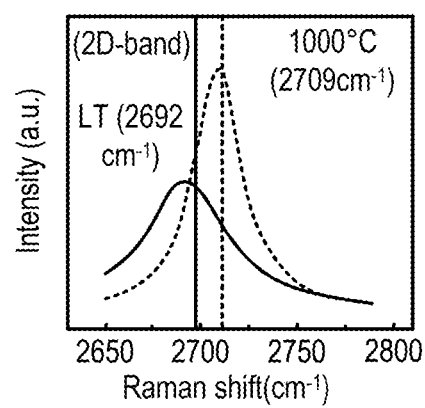
Figure 7E:
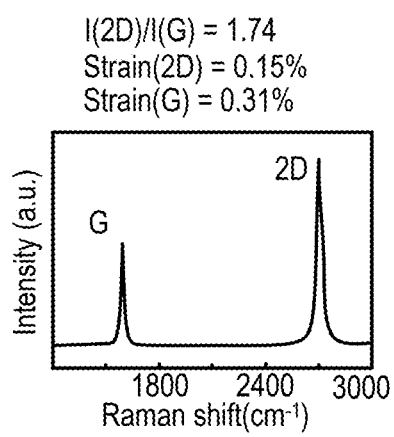
Figure 7F:
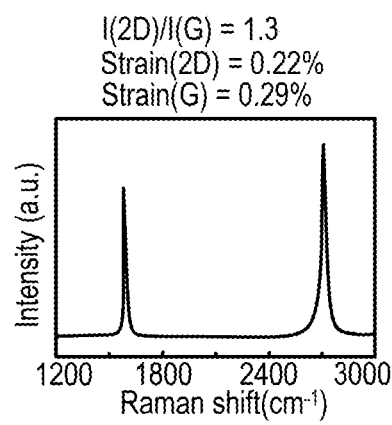

Referring to FIG. 7C, a Raman spectra for LT-grown graphene on a copper (100) single crystal substrate is illustrated. The G peak is associated with the zone center band of graphene in the film, and the 2D peak is associated with the monolayer of graphene. In the case of LT-growth on Cu (100), the graphene exhibits long-range homogeneous strain and absence of discernible edge states over the entire (8×13) mm² sample area according to Raman spectroscopic studies, as shown in FIG. 7E. FIG. 7F is a Raman spectra for 1000° C.-grown graphene on a Cu (100) single crystal substrate.

Referring to FIG. 7E, a Raman spectra for LT-grown graphene on a copper (111) single crystal substrate is illustrated. The G peak is associated with graphite in the film, and the 2D peak is associated with the monolayer of graphene. For LT-growth on Cu (111), the hydrogen plasma etching of the substrate was found to be anisotropic, which resulted in step-like features on the substrate surface. Therefore, stripe-like superstructures were sometimes found in large areas of LT-grown graphene on Cu (111) due to the underlying step-like features on the substrate. These stripe-like superstructures contributed to inhomogeneous strain distributions for LT-grown graphene on Cu (111). On the other hand, in flat areas of Cu (111), the strain was generally much reduced due to good lattice match between graphene and Cu (111), as exemplified in FIG. 7I. FIG. 7J is a Raman spectra for 1000° C.-grown graphene on a Cu (111) single crystal substrate.

FIG. 7A is a plot illustrating G-band modes for LT-grown graphene on a polycrystalline foil and 1000° C.-grown graphene on a polycrystalline foil. FIG. 7D is a plot illustrating 2D-band modes for LT-grown graphene on a polycrystalline foil and 1000° C.-grown graphene on a polycrystalline foil. The scale in FIGS. 7C and 7D is expanded in relation to the scale used in FIGS. 7A and 7B.

Figure 7G:
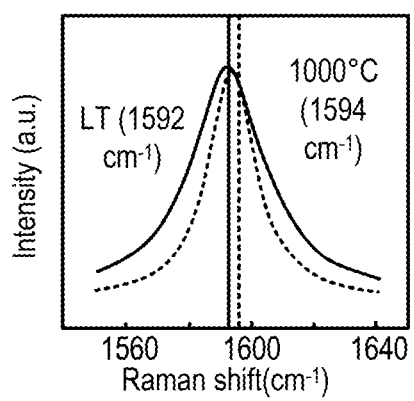
Figure 7H:
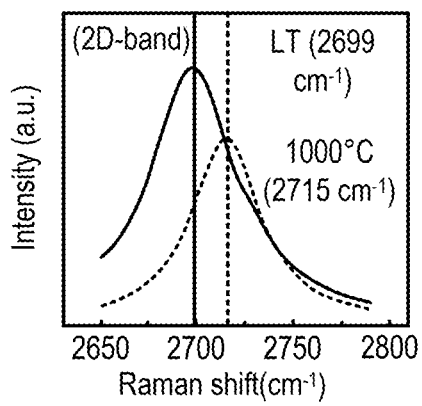
Figure 7I:
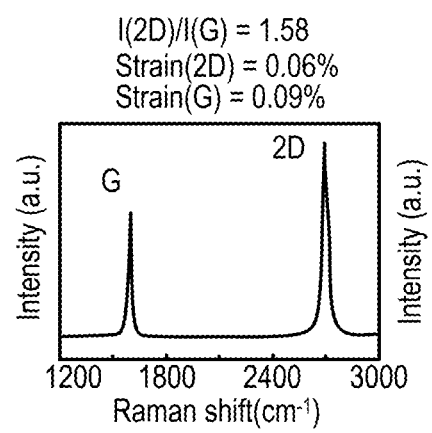
Figure 7J:
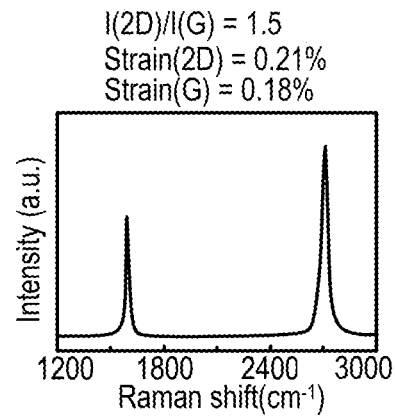

FIG. 7G is a plot illustrating G-band modes for LT-grown graphene on a single crystal (100) Cu substrate and 1000° C.-grown graphene on a single crystal (100) Cu substrate. FIG. 7H is a plot illustrating 2D-band modes for LT-grown graphene on a single crystal (100) Cu substrate and 1000° C.-grown graphene on a single crystal (100) Cu substrate. The scale in FIGS. 7G and 7H is expanded in relation to the scale used in FIGS. 7E and 7F.

Figure 7K:
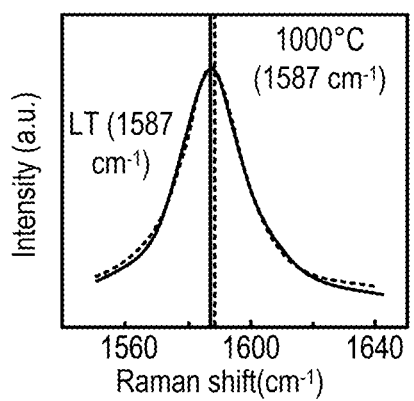
Figure 7L:
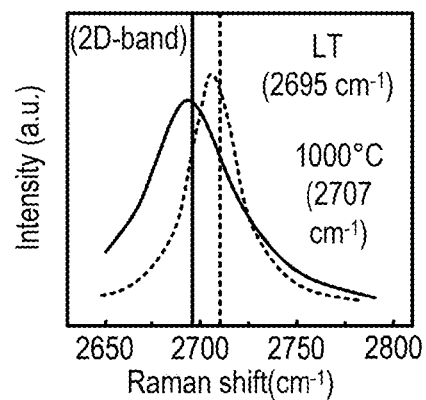

FIG. 7K is a plot illustrating G-band modes for LT-grown graphene on a single crystal (111) Cu substrate and 1000° C.-grown graphene on a single crystal (111) Cu substrate. FIG. 7L is a plot illustrating 2D-band modes for LT-grown graphene on a single crystal (111) Cu substrate and 1000° C.-grown graphene on a single crystal (111) Cu substrate. The scale in FIGS. 7K and 7L is expanded in relation to the scale used in FIGS. 7I and 7J.

As illustrated in FIGS. 7C/7D, 7G/7H, and 7K/7L, the Raman spectroscopic measurements demonstrate a general trend of downshifted Raman G-band and 2D-band modes that was observed for all LT-grown graphene relative to the corresponding 1000° C.-grown graphene on the same substrate, indicating a reduction in the averaged biaxial strain. Further, the absence of the D-band mode in most spectra suggests that the samples were largely free of disorder and edge states on macroscopic scales. Specifically, the biaxial strain ($\varepsilon_{ll}+\varepsilon_{tt}$) may be estimated from the Raman frequency shifts $\Delta\omega_m \equiv (\omega_m - \omega_m^0)$ using the Grüneisen parameter $\gamma_m^{biax}$ as follows:

$$\gamma_m^{biax} = \frac{\Delta\omega_m}{\omega_m^0(\varepsilon_{ll}+\varepsilon_{tt})},$$

where m (=G, 2D) refers to the specific Raman mode. Using the parameters n=1.8 and $\gamma_{2D}^{biax}$=2.7, the average strain of LT-grown graphene can be obtained, which is significantly reduced relative to the strain of 1000° C.-grown graphene, as exemplified by comparison of the G and 2D peaks in FIGS. 7C/7D, 7G/7H, and 7K/7L.

Thus, for samples on Cu foils and Cu (100), LT-grown graphene consistently yielded lower and spatially homogeneous phonon frequencies for both the 2D-band and zone-center G-band relative to those of the 1000° C.-grown graphene, indicating reduced strain due to LT-growth. For graphene on Cu (111), the G-band phonon frequency for both the 1000° C.-grown and LT-grown graphene exhibited no discernible differences within experimental resolution, whereas the 2D-band phonon frequency for the LT-grown sample showed a clear downshift relative to that of the 1000° C.-grown graphene.

FIGS. 8A-8H are strain maps for graphene (with the color code given in dimensionless units of %) over differing areas according to an embodiment of the present invention. FIGS. 8J-8P are strain histograms associated with the strain maps in FIGS. 8A-8H.

Figure 8A:
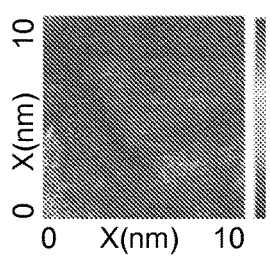
FIGS. 8A-8H are strain maps for graphene over differing areas according to an embodiment of the present invention.
Figure 8B:
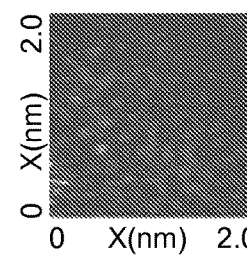
Figure 8I:
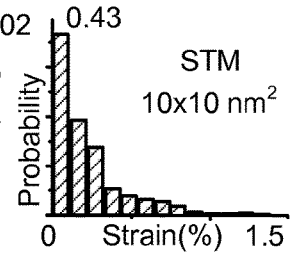
FIGS. 8I-8P are strain histograms associated with the strain maps in FIGS. 8A-8H.
Figure 8J:
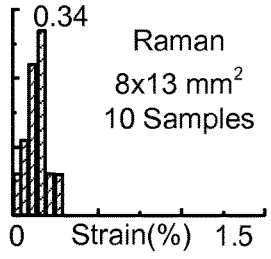
Figure 8C:
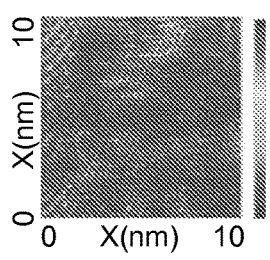
Figure 8D:
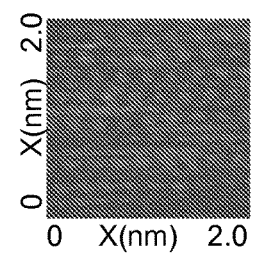
Figure 8K:
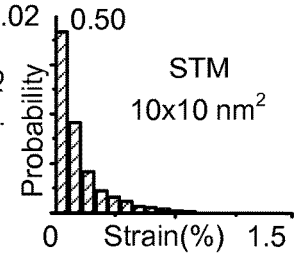
Figure 8L:
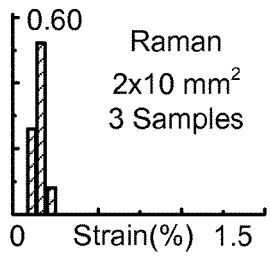
Figure 8E:
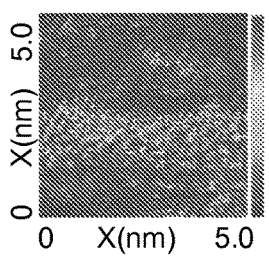

The strain maps are compression/dilation strain maps over successively decreasing areas taken with STM at 77 K for LT-grown graphene on Cu foil (FIGS. 8A and 8B); LT-grown graphene on single crystal Cu (100) (FIGS. 8C and 8D); LT-grown graphene on single crystal Cu (111) (FIGS. 8E and 8F); and 1000° C.-grown graphene on Cu foil (FIGS. 8G and 8H). The strain histograms illustrated in FIGS. 8I, 8K, 8M, and 8O were obtained from STM topographic studies over localized areas, whereas the strain histograms illustrated in FIGS. 8J, 8L, 8N, and 8P were obtained from Raman spectroscopic studies of different areas of multiple samples fabricated under the same condition for the corresponding substrates listed above. The typical strain obtained from STM data is significantly smaller in the case of all LT-grown graphene on Cu foils, Cu (100) and Cu (111), largely consistent with the findings from Raman spectroscopic studies. For the single crystal Cu (111) substrate, measurements over large areas (FIG. 8N), excessive strain associated with rippled graphene grown over steps of the Cu (111) surface occasionally were observed as the result of anisotropic plasma etching of the Cu (111) substrate.

The magnitude of the strain for LT-grown graphene was clearly much smaller and more homogeneous than those grown at 1000° C., particularly for LT-grown graphene on single crystals, as summarized by the strain histograms illustrated in FIGS. 8I-8P. Comparing the histograms shown in FIGS. 8F/8K/8M/8O to the histograms shown in FIGS. 8J/8L/8N/8P, the magnitude and spatial homogeneity of the strain distribution obtained from STM studies are consistent with the findings from Raman spectroscopy.

Figure 8F:
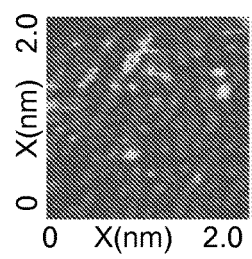
Figure 8M:
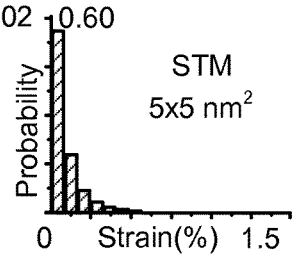
Figure 8N:
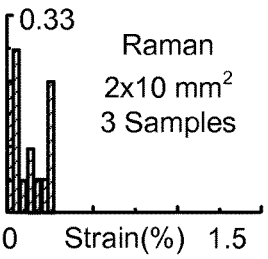
Figure 8G:
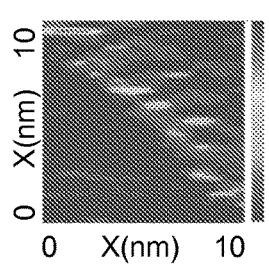
Figure 8H:
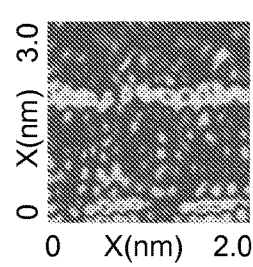
Figure 8O:
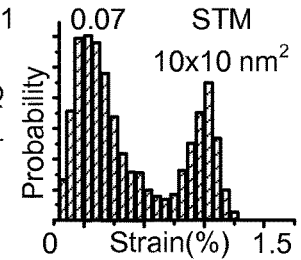
Figure 8P:
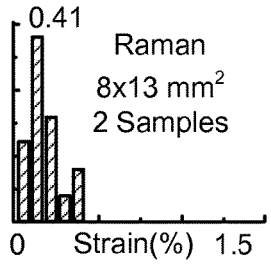

Further investigations of the Raman spectroscopy were conducted and summarized by the strain histograms shown in FIGS. 8F/8K/8M/8O and 8J/8L/8N/8P. Each of the histograms shown in FIGS. 8J, 8L, 8N, and 8P were obtained from a collection of Raman spectra taken on different areas of multiple graphene samples grown under the same conditions. In general, there was significant strain reduction and overall spatial strain homogeneity for all LT-grown graphene relative to the 1000° C.-grown graphene on the same substrate. The average values of strain associated with the LT-grown graphene were also significantly smaller than those reported for high-temperature epitaxial graphene grown on SiC and Cu (111). As illustrated, the strain of thermal CVD-grown graphene can vary widely with very large values (>1%) over a relatively small area, such as ~10 nm².

The quality of electrical transport properties was verified by studying the mobility ($\mu$) via both the Hall-bar geometry and the back-gated FET configuration. For some of these mobility studies, graphene samples were transferred to CVD-grown monolayer BN, lithographically processed into a back-gated FET geometry and placed on 300 nm SiO$_2$/Si substrates. The sheet resistance of graphene as a function of the back-gate voltage (V) and the corresponding conductivity ($\sigma$) vs. sheet carrier density ($n_s$) were measured at 300 K as illustrated in FIGS. 12A-B. The electrical mobility $\mu$ was obtained from the derivative of the Drude formula:

$$\mu = (1/C)d\sigma/dV,$$

where C denotes the capacitance of the device.

FIG. 13A is a plot illustrating representative sheet resistance vs. gate voltage (V) data taken at 300 K for a LT-grown graphene sample transferred from Cu foil to BN according to an embodiment of the present invention. FIG. 13B is a conductivity vs. sheet carrier density ($n_s$) plot converted from the data illustrated in FIG. 13A.

Figure 13C:
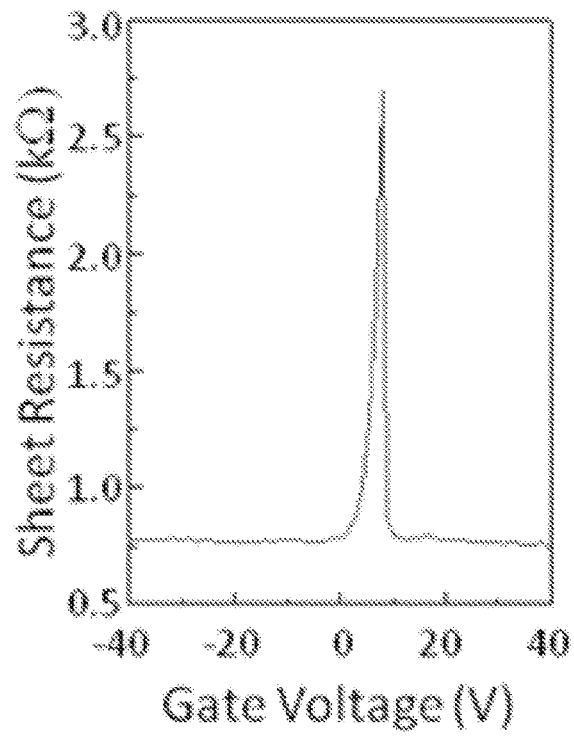
FIG. 13C is a table listing electron mobility data for nine different back-gated FET devices.
Figure 13C:
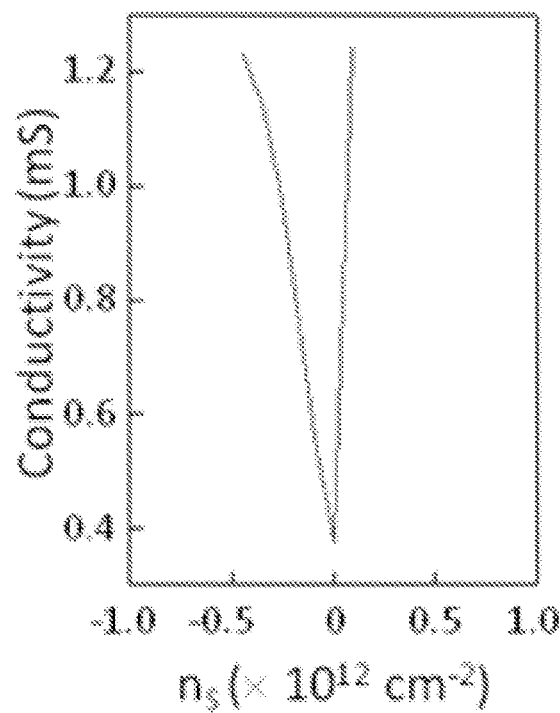

FIG. 13C is a table summarizing electron mobility data for nine different back-gated FET devices. As illustrated in FIG. 13C, the electron (hole) mobility thus obtained from a number of devices (e.g., 9 devices) ranged from $3.0\times10^4$ ($1.2\times10^4$) cm$^2$V$^{-1}$ s$^{-1}$ to $6.0\times10^4$ ($3.5\times10^4$) cm$^2$V$^{-1}$ s$^{-1}$, with an average of $4.4\times10^4$ ($2.0\times10^4$) cm$^2$V$^{-1}$ s$^{-1}$. These values of our one-step LT-grown graphene exceeded the best electron mobility (~$2.8\times10^4$ cm$^2$V$^{-1}$ s$^{-1}$) of thermal CVD-grown graphene on BN, even when post annealed and measured at 4.2 K, and were also better than state-of-the-art mobility (~$1.1\times10^4$ cm$^2$V$^{-1}$ s$^{-1}$) of multi-step-processed thermal-CVD grown graphene transferred to SiO$_2$.

Referring to FIGS. 13A-C, it should be noted that electronic mobility of LT-graphene exceeds 20,000 cm$^2$V$^{-1}$ s$^{-1}$, and in some devices, exceeds 30,000 cm$^2$V$^{-1}$ s$^{-1}$. These values, which are an order of magnitude greater than the mobility of silicon and is a reasonable value to support ballistic electron motion, which is utilized for nano-electronic applications as described herein.

The unique properties associated with low temperature graphene (LT-graphene) provided by embodiments of the present invention enable a number of novel applications, including nano-electronics and table-top free electron lasers based on strain-engineering, transparent electrodes in opto-electronic devices such as photovoltaic cells (PVCs) and light emitting diodes (LEDs), interconnects in electrical circuits, graphene-based photonic crystals, and digital circuits based on strain-engineered nano-transistors.

Graphene-Based Nano-Electronics Based on Strain Engineering

Because graphene comprises a single layer of carbon atoms, and because of the fundamental nature of Dirac fermions, the electronic properties of graphene exhibit significant dependence on the surrounding environment and high susceptibility to disorder. There are two primary effects associated with disorder on the electronic properties of graphene. The first effect is a local change in the single site energy that leads to an effective shift in the chemical potential for Dirac fermions. One example of this type of disorder stems from charge impurities. The second type of disorder effect arises from changes in the distance or angles between the $p_z$ orbitals. In this case, the hopping energies (and thus hopping amplitudes) between different lattice sites are modified, leading to the addition of a new term to the original Hamiltonian. The new term leads to the appearance of a vector (gauge) potential $\mathcal{A}$ and a scalar potential $\Phi$ in the Dirac Hamiltonian. The presence of a vector potential in the problem indicates that an effective magnetic field $B_S = \nabla \times \mathcal{A}$ may also be present for a non-trivial gauge potential, with opposite directions for the two inequivalent Dirac cones at K and K' so that the global time-reversal symmetry is preserved. Similarly, the presence of a spatially varying scalar potential can lead to local charging effects known as self-doping. One mechanism for inducing pseudo-magnetic fields and charging effects is strain, which is further elaborated below.

Strain-Induced Pseudo-Magnetic Fields and Charging Effects

The strong susceptibility of graphene to external influences can in fact provide opportunities for engineering unique properties of graphene based on precise control of where and when the specific type and strength of the strain is. Embodiments of the present invention utilize a large sheet of nearly strain-free graphene, and then nano-engineer the structures and mechanisms to position the desirable strain. Conventional thermal CVD-grown graphene is unsuitable for these structures because of spatially varying strain for as grown samples. While additional processing steps and transfer of samples from copper to other substrates may reduce the strain of thermal CVD-grown graphene in localized areas, these conventional samples typically break off into small pieces upon transfer, and the excess processing steps are time consuming and generally incompatible with most device fabrication. In contrast, the LT-graphene provided by embodiments of the present invention is fabricated with a fast, one-step growth process, and the samples retain their mechanical integrity and are nearly strain-free over an large area after being transferred to other substrates. These unique properties thus make reliable and reproducible strain-engineering of graphene-based feasible for the first time.

To quantify the strain tolerance for nano-electronic applications, we consider the following theoretical calculations. The strain-induced gauge potential $\mathcal{A} = (A_x, A_y)$ may be related to the two-dimensional strain field $u_{ij}(x, y)$ by the following relation (with x-axis along the zigzag direction):

$$\mathcal{A} = \begin{pmatrix} A_x \\ A_y \end{pmatrix} = \frac{-(\partial \ln t / \partial \ln a)}{a} \left(\frac{h}{e}\right) \begin{pmatrix} u_{xx} - u_{yy} \\ -2u_{xy} \end{pmatrix} \equiv \frac{\beta}{a}\left(\frac{h}{e}\right)\begin{pmatrix} u_{xx} - u_{yy} \\ -2u_{xy} \end{pmatrix}, \quad (1)$$

where t denotes the nearest hopping constant, a represents the nearest carbon-carbon distance, h is the Plank constant, e is the electron charge, and $\beta$ is a constant ranging from 2 to 3. In the radial representation, a uniform pseudo-magnetic field $B_S = 8(\beta/a)(h/e)(\Delta_m/D)$ is achieved for the displacements $\mu_r = (\Delta_m/D) r^2 \sin 3\theta$, $u_\theta = (\Delta_m/D) r^2 \cos 3\theta$, where $\Delta_m$ is the strain, D is the effective range of the strain, and $B_S$ is given in units of Tesla. Theoretically, strain-induced pseudo-magnetic fields can give rise to discrete peaks in the electronic density of states at quantized energies (proportional to $\pm|n|^{1/2}$ where n denotes integers for uniform pseudo-magnetic fields) relative to the Dirac energy, and the induced charging effects can produce localized high conductance regions wherever maximum strain occurs. Specifically, the pseudo-Landau levels $E_n$ of Dirac electrons under a given $B_S$ satisfy the following relation:

$$E_n = \text{sgn}(n)\sqrt{2ev_F^2 \hbar B_S |n|}, \quad (2)$$

where n denotes either integers or fractional numbers. Therefore, the slope of $(E - E_{Dirac})$ vs. $|n|^{1/2}$ for each point spectrum is directly proportional to $(B_S)^{1/2}$, and $v_F \sim 10^6$ m/s. For n=1, the energy gap is approximately given by $\delta E \sim 400$ K $(B_S)^{1/2}$ for $B_S$ in units of Tesla. Therefore, a noticeable strain-induced pseudo-magnetic field at temperature T (given in units of absolute temperature K) may be estimated by the relation $\delta E \sim k_B T$, where $k_B$ is the Boltzmann constant. Any strain-induced energy gaps comparable to or exceeding the thermal energy $k_B T$ can give rise to significant influence on the electronic characteristics of graphene. Hence, for typical strain ranging from $\Delta_m \sim 1\%$ to $\sim 10\%$ in conventional thermal CVD-grown graphene occurring over $\sim 10$ nm length scale, we find that $\delta E$ varies from $\sim 8000$ K to $\sim 2500$ K, significantly exceeding the typical thermal energy of samples, implying strong effects on altering the electronic properties of graphene.

Similarly, the strain-induced charging effects of conventional thermal CVD-grown graphene are found comparable in the energy scale to that of the pseudo-magnetic fields, implying significant strain-induced effects on the electronic properties of thermal CVD-grown graphene. Moreover, the strain of conventional thermal CVD-grown graphene is spatially inhomogeneous, which makes it difficult or impossible to implement strain-engineering. In contrast, the strain of LT-grown graphene is typically <0.02% over length scales >100 nm. Consequently, the resulting SE becomes <20 K, which is negligible for most room temperature (T~300 K) applications, enabling the nano-scale strain-engineering of graphene described herein.

Based on this analysis, embodiments of the present invention provide several different types of strain-engineered graphene nano-devices using LT-graphene. Noting that graphene is a membrane of only one atomic thickness, the potential exists to alter its electronic properties using strain by placing a sheet of initially nearly strain-free graphene on an appropriately textured substrate. Thus, the electronic characteristics of graphene may be modified in predetermined locations with desirable properties according to pertinent designs for the textures of the substrates.

Strain-Engineered Graphene Nano-Transistors

Figure 10A:
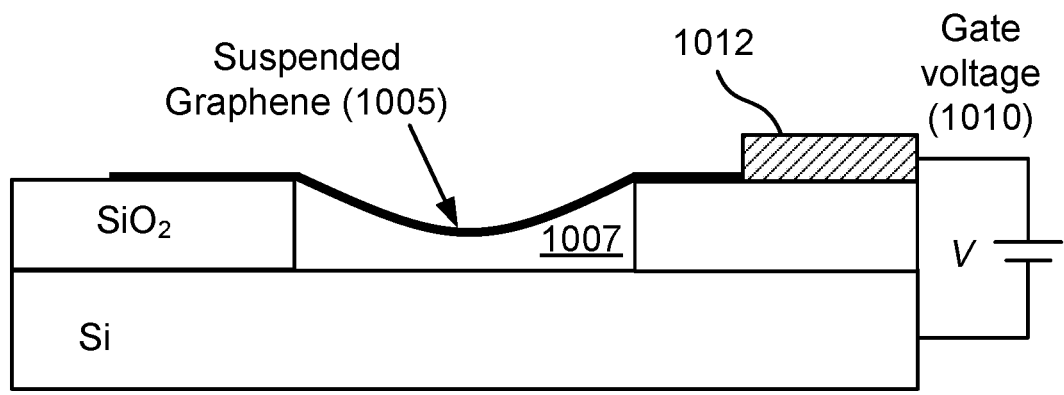
FIG. 10A is a simplified schematic diagram illustrating a graphene-based nano-transistor according to an embodiment of the present invention.

A first example of a strain-engineered nano-electronic devices is a nano-transistor. FIG. 10A is a simplified schematic diagram illustrating a graphene-based nano-transistor according to an embodiment of the present invention. Referring to FIG. 10A, a gate voltage (V) 1010 is applied to electric contact 1012 and controls the deformation of the graphene 1005 suspended over a triangular-shaped nano-trench 1007, having a nano-gap, leading to high (low) source-drain conductance whenever a large strain is induced (removed). In an embodiment, the nano-gap of the nano-trench 1007 has dimensions ranging from about 10 nm to about 100 nm although the present invention is not limited to these particular values.

Figure 10B:
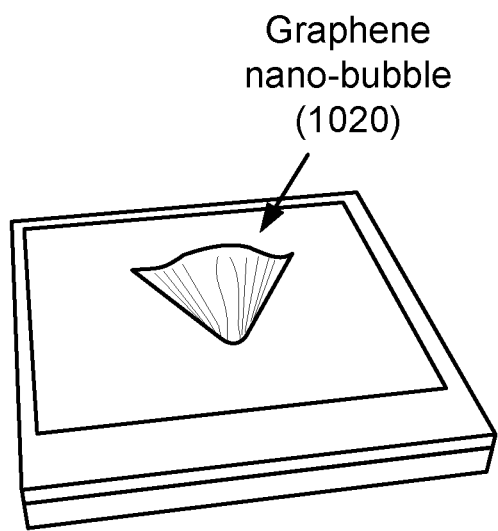
FIG. 10B is a simplified schematic diagram illustrating a graphene-based nano-transistor according to another embodiment of the present invention.
Figure 10C:
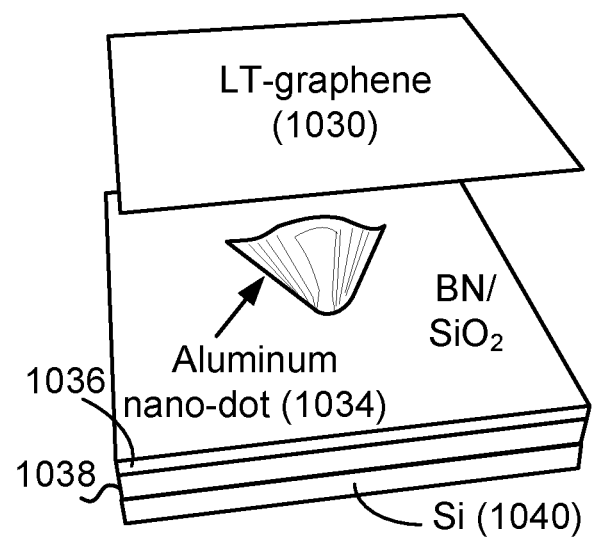
FIG. 10C is an exploded view of the graphene-based nano-transistor illustrated in FIG. 10B.

FIG. 10B is a simplified schematic diagram illustrating a graphene-based nano-transistor according to another embodiment of the present invention. FIG. 10C is an exploded view of the graphene-based nano-transistor illustrated in FIG. 10B. In this alternative design, built-in strain in graphene nano-bubbles 1020 is achieved by transferring LT-graphene 1030 to a nano-engineered substrate with an aluminum nano-dot 1034 (of a geometry known to induce a predetermined (e.g., maximum) strain). Referring to FIG. 10C, a monolayer of BN film 1036 is deposited on a SiO$_2$ layer 1038 deposited on silicon substrate 1040 to provide the nano-engineered substrate since BN is a suitable substrate for optimizing the mobility of graphene-based devices. Controlling the gate voltage to values coinciding with or deviating from the strain-induced quantized energy levels could switch the source-drain conductance of the deformed graphene to either high or low levels. Thus, the devices illustrated in FIGS. 10A and 10B provide an element or unit of a nano-transistor with a large on/off ratio and fast responses at room temperature. For mesoscopic-scale applications, arrays of aluminum nano-dots can be evaporated onto a BN/SiO$_2$/Si substrate as illustrated in FIG. 10C, with the areal density of the aluminum nano-dots tailored to optimize the performance. The present invention is not limited to aluminum nano-dots for providing the nano-scale strain engineering. Any nano-structures that have the necessary geometry to provide significant strain after being deposited on a substrate for the LT-graphene can be used for fabricating the nano-transistors described in this invention.

Figure 11A:
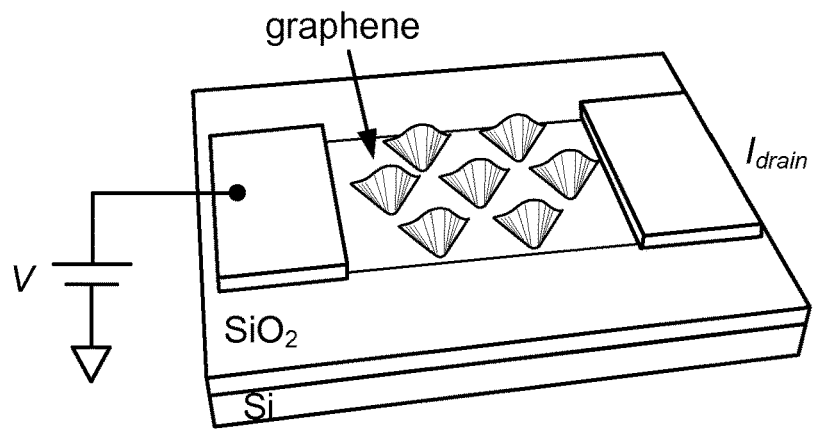
FIG. 11A is a simplified schematic diagram of a graphene nano-transistor with graphene laid over periodic arrays of triangular nano-dots according to an embodiment of the present invention.

FIG. 11A is a simplified schematic diagram of a graphene nano-transistor with graphene laid over periodic arrays of triangular nano-dots according to an embodiment of the present invention. The design illustrated in FIG. 11A can be used to optimize the strength and uniformity of the strain-induced pseudo-magnetic fields.

Using LT-graphene sheets, the longitudinal resistivity $\rho_{xx}$ of LT-graphene under a uniform strain-induced pseudo-magnetic field $B_S$=50 Tesla can be computed. For implementations of strained graphene nano-transistors, an assembly of arrays of such transistors can be considered, which may be considered as a network of serial and parallel connections of both strained and unstrained graphene resistors.

Figure 11B:
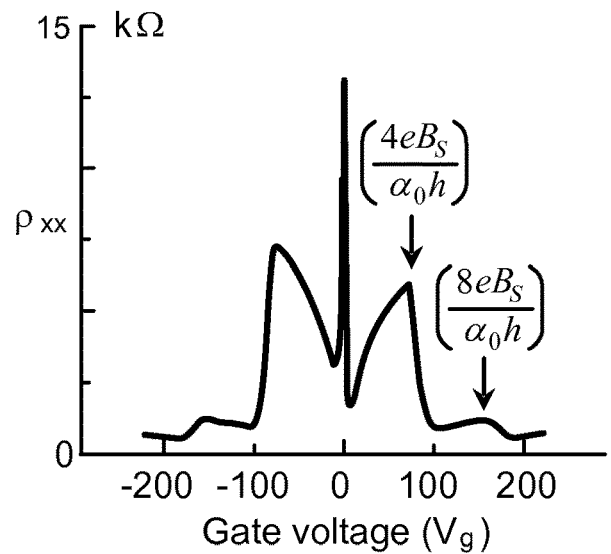
FIG. 11B is a plot showing the calculated resistivity vs. voltage for a graphene resistors in series according to an embodiment of the present invention.

FIG. 11B is a plot showing the calculated resistivity vs. voltage for a graphene resistors in series according to an embodiment of the present invention. Referring to FIG. 11B, the $\rho_{xx}$-vs.-$V_g$ data ($V_g$ being the gate voltage, which is directly proportional to the two-dimensional carrier density $n_{2D}$ in the graphene sheet by the relation $n_{2D}=\alpha_0 V_g$, and $\alpha_0$ is a coefficient dependent on the dielectric constant of silicon) is given for a serial connection of equally weighted strained and unstrained graphene resistors. This plot of the $\rho_{xx}$-vs.-$V_g$ characteristics is based on a serial connection of two equally weighted strained and unstrained graphene resistors with resistivity $(\rho_{xx})_S$ and $(\rho_{xx})_0$, respectively, so that $\rho_{xx}=0.5(\rho_{xx})_S+0.5(\rho_{xx})_0$, and the resistivity ratio $[(\rho_{xx})_{on}/(\rho_{xx})_{off}]$ ~7 for $V_{on}$=0 and $4eB_S/(\alpha_0 h) < V_{off} < 8eB_S/(\alpha_0 h)$ where h is the Planck constant, and we have assume $B_S$=50 Tesla, and the coefficient $\alpha_0$=7.3×10$^{14}$ m$^{-2}$V$^{-1}$ is defined by the linear relationship between the gate voltage and the two-dimensional carrier density $n_{2D}=\alpha_0 V_g$.

Figure 11C:
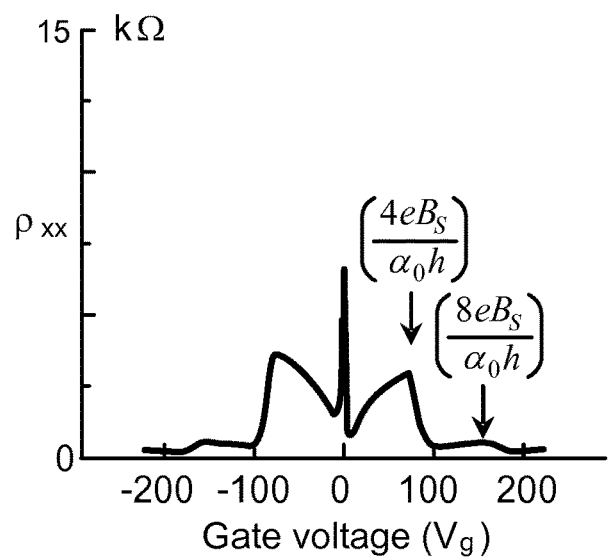
FIG. 11C is a plot showing the calculated resistivity vs. voltage for graphene resistors in parallel according to an embodiment of the present invention.

FIG. 11C is a plot showing the calculated resistivity vs. voltage for graphene resistors in parallel according to an embodiment of the present invention. This this plot, the parallel connections of two sets of structures such that, $\rho_{xx}=0.25(\rho_{xx})_S+0.75(\rho_{xx})_0$, and the resistivity ratio $[(\rho_{xx})_{on}/(\rho_{xx})_{off}]$~4 for $V_{on}$=0 and $4eB_S/(\alpha_0 h) < V_{off} < 8eB_S/(\alpha_0 h)$ for $B_S$=50 Tesla. Referring to FIG. 11C, the $\rho_{xx}$-vs.-$V_g$ data for the parallel connection of the graphene resistors used in FIG. 11B.

The resistive peaks are associated with quantized Landau levels induced by finite pseudo-magnetic fields. If we define $(\rho_{xx})_{on}$ as the maximum resistivity at the Dirac energy (where $V_g \approx 0$ for undoped, ideal graphene samples) and $(\rho_{xx})_{off}$ as the minimum resistivity occurring between the gate voltages corresponding to the quantized energies $E_1$ and $E_2$, where $E_n$ with n=1 and 2 are given by EQ. (2), we find that the overall $[(\rho_{xx})_{on}/(\rho_{xx})_{off}]$ ratio is larger in the serial connections, whereas parallel connections tend to reduce the on/off ratios. Overall, the optimal strain-induced effects can be achieved by maximizing the weight associated with the strained graphene. Furthermore, it should be noted that the fabrication of arrays of nano-dots on the substrates for straining graphene can be achieved by means of either standard nano-lithography or self-assembly techniques.

Graphene-Based Current-Splitter/Switch and Table-Top Free Electron Laser

Figure 12:
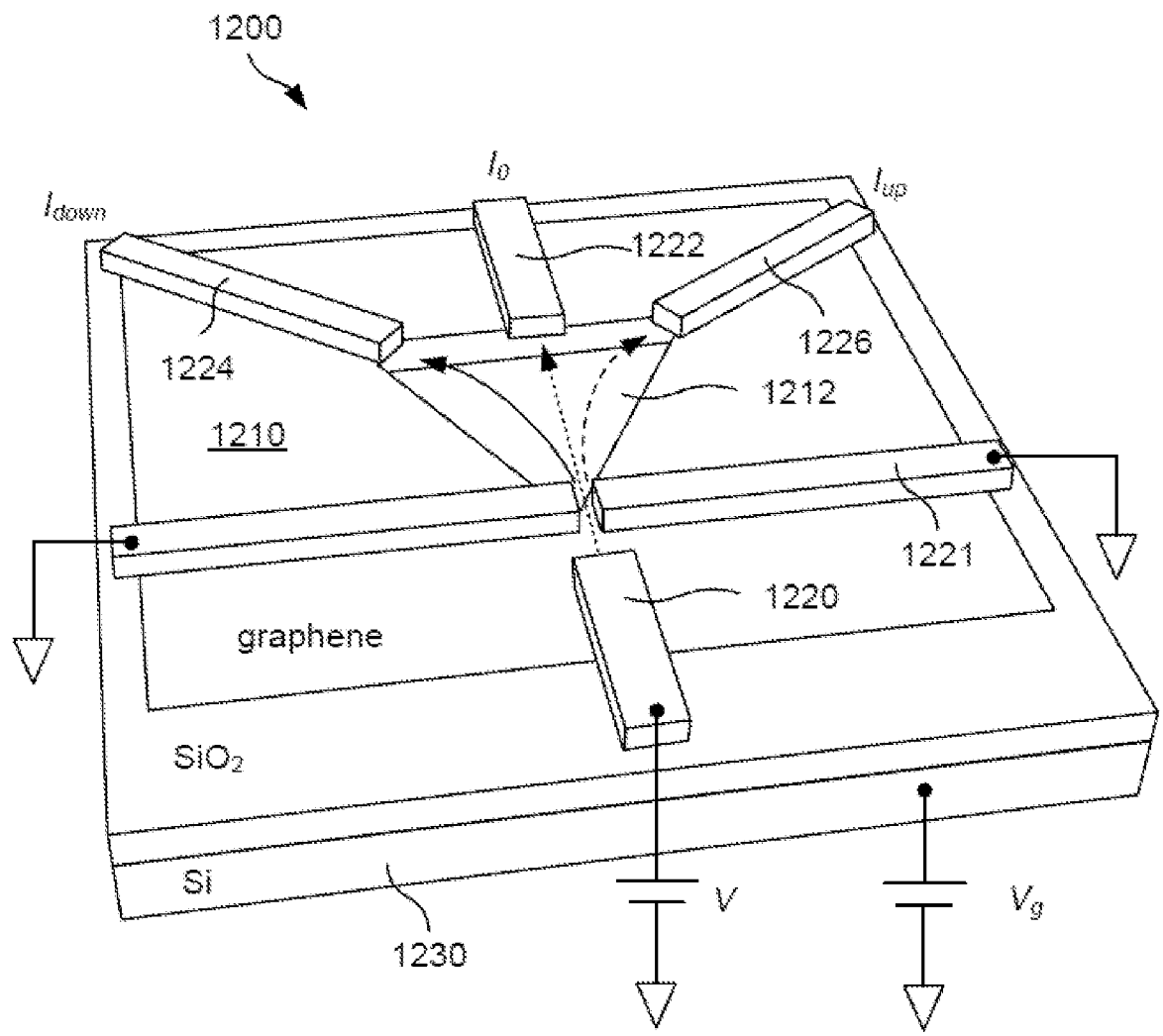
FIG. 12 is a simplified perspective diagram of a nano-switch according to an embodiment of the present invention.

FIG. 12 is a simplified perspective diagram of a nano-switch according to an embodiment of the present invention. The device illustrated in FIG. 12 can form the basis suitable for a "valley splitter" device or an array of such devices. Specifically, the strain-induced pseudo-magnetic fields in an otherwise nearly strain-free LT-graphene sample have opposite effects on deflecting the Dirac fermions associated with the inequivalent valley indices K and K' of graphene. Therefore, this strain-induced effect can be used to implement a device based on manipulating electrons according to their valley index, which is an extra degree of freedom also known as the "pseudo-spin" in addition to the physical spin. This index may be a means to convey information in graphene circuits, leading to possible "valleytronics" in analogy to spintronics. Embodiments of the present invention enable valleytronics using a splitter that can produce pure valley states. The inventors have thus developed splitters using strain-induced pseudo-magnetic fields described previously. Given that the pseudo-magnetic field affects the two Dirac cones in a different manner, with the effective field $B_S$ for one valley is –$B_S$ for the other valley, if a non-polarized beam were to pass through a region with a pseudo-magnetic field present, electrons in the two valley states would follow divergent paths.

Referring to FIG. 12, the strain-engineered graphene valley splitting/switching device 1200 includes a sheet of LT-graphene 1210 that is suspended over a triangular hole 1212 and strained by electrostatic forces from a gate voltage $V_g$, creating a pseudo-magnetic field with a finite $V_g$ that splits electron paths according to their valley state. Although a triangular hole 1212 is illustrated, the shape of the hole is not constrained by this example. This design may also be used as a current switch.

Quantitatively, referring to FIG. 12, for a graphene sheet 1210 suspended above a triangular hole ~200 nm on a side 1212, a gate voltage $V_g$ of 80 V could produce a cyclotron radius of ~300 nm, enabling a divergence of the beam to the opposite sides of the device within its area. Referring to FIG. 12, the splitter utilizes ballistic electron transport, which is readily attainable in LT-graphene on BN having a mobility of ~60,000 cm$^2$/Vs or larger, sufficient to ensure ballistic transport over the device area. In addition, these devices could analyze the pseudo-spin (or valley) polarization of a current: If the input beam is valley polarized, in the presence of a pseudo-magnetic field, only one of the contacts can collect the current and the particular one would indicate the pseudo-spin state.

In addition to splitting electrical currents by the valley index, the pseudo-magnetic field could divert current flow from the central contact with current $I_0$ to the side contacts enabling switching. As illustrated in FIG. 12, a source contact 1220 with voltage V, which can be referred to as an electron source, injects electrons into the device. These electrons pass through the graphene layer 1210 and then through an aperture in a grounded wire 1221 before proceeding into the device where they are collected by electron sinks, illustrated by the current contacts $I_{up}$, $I_{down}$, and $I_0$ (1226, 1224, and 1222, respectively). If the pseudo-magnetic field is zero, the current flows from the electron source 1220 to the electron sink at contact 1222 $I_0$. With the field present, the current is mainly collected by the electron sinks that are not aligned with the axis passing from contact 1220 to contact 1222, illustrated by contacts 1224 and 1226, i.e., the $I_{down}$ and $I_{up}$ contacts.

In one embodiment, to fabricate the devices, a triangular hole 1212 is etched in the $SiO_2$/Si substrate 1230, and then a sheet of LT-graphene 1210 is placed over the nano-fabricated hole, followed by attaching leads via e-beam lithography to the various contacts. In some embodiments, a monolayer of BN is placed between the graphene layer 1210 and the $SiO_2$ layer of the substrate 1230 to mitigate any degradation of electronic mobility due to undesirable interaction between the graphene layer and the $SiO_2$ layers. Although $SiO_2$ is illustrated in FIG. 12, other insulating layers including other oxides, nitrides, and the like can be utilized. One of ordinary skill in the art would recognize many variations, modifications, and alternatives.

The deflection of Dirac electron beam by pseudo-magnetic field, as illustrated in FIG. 12, is also the underlying principle for a free electron laser based on strain-engineering of superior graphene. Specifically, Dirac electrons are effectively relativistic, and successive deflection of the electron beam can be achieved by positioning triangular nano-holes or nano-dots along the same cyclotron orbit so that coherent acceleration of Dirac electrons leads to synchrotron radiation. The spectral content (e.g., wavelengths) of the radiation will be determined by the magnitude of the pseudo-magnetic field, or equivalently, the strain in the graphene induced by the nano-structures, hence by the spacing and size of the triangular nano-holes or nano-dots. These triangular nano-structures are the equivalence of the "wigglers" in conventional laboratory free electron lasers, except that no real magnets are required in the strain-engineered graphene-based free electron laser.

Graphene-Based Interconnects and Photonic Crystals

Interconnects with the graphene-on-copper configuration provide a number of advantages over existing copper interconnects. First, both the electrical and thermal conductivity of such interconnects can be much improved because graphene is a superb electrical and thermal conductor. Second, the risk of thinning copper interconnects and therefore increasing electrical resistivity and increasing heat dissipation with time due to electron migration can be mitigated because the integrity of the $sp^2$ bonds in graphene will remain intact with time, thereby providing a long-lasting conduction path even in the event of failure of the parallel copper conduction path. Photonic crystalline structures can be fabricated by depositing graphene on skeletons of photonic crystalline structures coated with thin films of copper. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming graphene, the method comprising:
    placing a growth substrate in a processing chamber;
    introducing a cleaning gas including hydrogen and nitrogen into the processing chamber;
    introducing a carbon source into the processing chamber;
    initiating a microwave plasma in the processing chamber;
    forming cyano radicals from the carbon source and the nitrogen in the processing chamber in the presence of the microwave plasma;
    cleaning the growth substrate with the cyano radicals formed in the processing chamber; and
    subjecting the growth substrate to the microwave plasma and a flow of the cleaning gas and the carbon source for a predetermined period of time to form the graphene characterized by grains ranging in size between 100 μm and 300 μm; with the microwave plasma, while forming the graphene having a maximum temperature at the center of the microwave plasma, wherein the maximum temperature is 425° C. and a temperature of the growth substrate is less than the maximum temperature.

2. The method of claim 1 wherein the graphene consists of a single monolayer.

3. The method of claim 1 wherein the graphene is characterized by a measurement area in a unit of length squared and a height variation measured in the unit of length, wherein the measurement area is between 4 $nm^2$ and 100 $nm^2$, and a ratio of the height variation to the measurement area is less than 10% per unit of length.

4. The method of claim 3 wherein the ratio is less than 1% per unit of length.

5. The method of claim 3 wherein the ratio of the height variation to the measurement area is measured at room temperature.

6. The method of claim 1 wherein introducing the cleaning gas and introducing the carbon source are performed concurrently.

7. The method of claim 1 wherein the carbon source comprises methane.

8. The method of claim 1 wherein the growth substrate comprises a copper substrate.

9. The method of claim 8 wherein the copper substrate is a single crystal copper substrate.

10. The method of claim 9 wherein the single crystal copper substrate is a single crystal (100) substrate.

11. The method of claim 9 wherein the single crystal copper substrate is a single crystal (111) substrate.

12. The method of claim 8 further comprising at least one of etching or smoothing the copper substrate.

13. The method of claim 1 further comprising removing native oxide present on the growth substrate after initiating the microwave plasma.

14. The method of claim 13 wherein introducing the carbon source is performed prior to removing the native oxide.

15. The method of claim 1 wherein the growth substrate is a polycrystalline copper foil and the graphene is characterized by a first Raman peak associated with a 2D-band mode and a second Raman peak associated with a G-band mode, wherein a ratio of the first Raman peak to the second Raman peak is about three.

16. The method of claim 1 wherein the growth substrate is a polycrystalline copper foil and the graphene is characterized by a Raman spectra having a G-band peak less than a G-band peak of 1000° C. grown graphene.

17. The method of claim 1 wherein the growth substrate is a polycrystalline copper foil and the graphene is characterized by a Raman spectra having a 2D-band peak measured in wavenumbers less than a 2D-band peak of 1000° C. grown graphene.

* * * * *